(12) United States Patent
Ahn et al.

(10) Patent No.: US 11,114,535 B2
(45) Date of Patent: Sep. 7, 2021

(54) INTEGRATED CIRCUIT DEVICES AND METHODS OF MANUFACTURING THE SAME

(71) Applicant: Samsung Electronics Co., Ltd., Suwon-si (KR)

(72) Inventors: Hak-yoon Ahn, Seoul (KR); Sang-hyun Lee, Hwaseong-si (KR); Sung-woo Kang, Suwon-si (KR); Hong-sik Shin, Seoul (KR); Seong-han Oh, Namyangju-si (KR); Young-mook Oh, Hwaseong-si (KR); In-keun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 295 days.

(21) Appl. No.: 16/152,956

(22) Filed: Oct. 5, 2018

(65) Prior Publication Data
US 2019/0305098 A1 Oct. 3, 2019

(30) Foreign Application Priority Data
Mar. 27, 2018 (KR) .................. 10-2018-0035362

(51) Int. Cl.
*H01L 29/417* (2006.01)
*H01L 21/8234* (2006.01)
(Continued)

(52) U.S. Cl.
CPC ............. *H01L 29/41791* (2013.01); *H01L 21/823475* (2013.01); *H01L 29/7851* (2013.01); *H01L 21/0217* (2013.01); *H01L 21/02164* (2013.01); *H01L 21/0332* (2013.01); *H01L 21/0337* (2013.01); *H01L 21/31111* (2013.01); *H01L 21/31144* (2013.01); *H01L 21/76802* (2013.01); *H01L 21/76897* (2013.01); *H01L 21/823431* (2013.01); *H01L 27/0886* (2013.01); *H01L 29/0847* (2013.01); *H01L 29/165* (2013.01);
(Continued)

(58) Field of Classification Search
CPC ....... H01L 29/41791; H01L 21/823475; H01L 29/7851; H01L 29/7853; H01L 2029/7858; H01L 27/0886; H01L 29/6656; H01L 29/0847; H01L 29/785; H01L 29/42364; H01L 21/823431
See application file for complete search history.

(56) References Cited

U.S. PATENT DOCUMENTS 8,741,723 B2 6/2014 Chi
9,368,349 B2 6/2016 Huang et al.
(Continued)

FOREIGN PATENT DOCUMENTS

KR 1006998650000 3/2007

*Primary Examiner* — Khaja Ahmad
*Assistant Examiner* — Pavel G Ivanov
(74) *Attorney, Agent, or Firm* — Muir Patent Law, PLLC

(57) ABSTRACT

A semiconductor device may include a substrate including a fin active region extending in a first direction, a gate structure crossing the fin active region and extending in a second direction crossing the first direction, source/drain regions on the fin active region at opposite sides of the gate structure, a first contact structure electrically connected to one of the source/drain regions, a pair of first contact block structures on opposite first sidewalls, respectively, of the first contact structure in the second direction.

18 Claims, 30 Drawing Sheets

(51) Int. Cl.
  *H01L 29/78* (2006.01)
  *H01L 21/033* (2006.01)
  *H01L 27/088* (2006.01)
  *H01L 29/165* (2006.01)
  *H01L 29/45* (2006.01)
  *H01L 21/768* (2006.01)
  *H01L 21/311* (2006.01)
  *H01L 29/66* (2006.01)
  *H01L 21/02* (2006.01)
  *H01L 29/08* (2006.01)

(52) U.S. Cl.
  CPC .......... *H01L 29/45* (2013.01); *H01L 29/6656* (2013.01); *H01L 29/66545* (2013.01); *H01L 29/7853* (2013.01); *H01L 2029/7858* (2013.01)

(56) References Cited

U.S. PATENT DOCUMENTS

| | | |
|---|---|---|
| 9,553,018 B2 | 1/2017 | Bristol et al. |
| 9,679,805 B2 | 6/2017 | Bouche et al. |
| 9,698,016 B2 | 7/2017 | Huang et al. |
| 9,793,164 B2 | 10/2017 | Machkaoutsan et al. |
| 2004/0149992 A1 | 8/2004 | Park et al. |
| 2007/0072407 A1 | 3/2007 | Kim et al. |
| 2012/0153366 A1 | 6/2012 | Werner et al. |
| 2016/0322298 A1 | 11/2016 | Bouche et al. |
| 2018/0151564 A1* | 5/2018 | Lee ................. H01L 21/823481 |

* cited by examiner

INTEGRATED CIRCUIT DEVICES AND METHODS OF MANUFACTURING THE SAME

CROSS-REFERENCE TO RELATED APPLICATION

This application claims priority under 35 U.S.C. § 119 to Korean Patent Application No. 10-2018-0035362 filed on Mar. 27, 2018 in the Korean Intellectual Property Office, the entire contents of which are hereby incorporated herein by reference in their entirety.

FIELD

Embodiments of the present inventive concepts relate generally to integrated circuit devices and methods of manufacturing the same, and more specifically, to integrated circuit devices including a fin active region and methods of manufacturing the same.

BACKGROUND

With development of small and light electronic devices, an integrated circuit device may be highly integrated and down-scaled. As an integrated circuit device is down-scaled, a short channel effect of a transistor may be generated. Thus, the reliability of the integrated circuit device may be lowered. An integrated circuit device may include a fin active region to suppress the short channel effect. However, as a design rule is reduced, a size of a contact structure electrically connected to the fin active region may also be reduced.

SUMMARY

According to some embodiments of the inventive concepts, a semiconductor device may include a substrate including a fin active region extending in a first direction, a gate structure crossing the fin active region and extending in a second direction crossing the first direction, source/drain regions on the fin active region at opposite sides of the gate structure, and a first contact structure electrically connected to one of the source/drain regions. The first contact structure may include first and second sidewalls extending in the first direction opposite each other in the second direction and a third sidewall extending in the second direction between the first and second sidewalls. The device may include a pair of first contact block structures on the first and second sidewalls, respectively, of the first contact structure, and an interlayer insulation layer on the gate structure. The interlayer insulation layer may be adjacent to the third sidewall of the first contact structure in the first direction and adjacent to a fourth sidewall of each of the pair of first contact block structures in the first direction.

According to some embodiments of the inventive concepts, a semiconductor device may include a substrate including a fin active region extending in a first direction, a plurality of gate structures crossing the fin active region and extending in a second direction crossing the first direction, a source/drain region between adjacent ones of the gate structures, a first contact structure on the source/drain region, between the adjacent ones of the gate structures, and a pair of first contact block structures on opposite sidewalls, respectively, of the first contact structure, between the adjacent ones of the gate structures.

According to some embodiments of the inventive concepts, a semiconductor device may include a substrate including a fin active region extending in a first direction, a plurality of gate structures crossing the fin active region and extending in a second direction crossing the first direction, a source/drain region between two adjacent ones of the gate structures, a first contact structure on the source/drain region, between the two adjacent ones of the gate structures, a pair of first contact block structures on opposite sidewalls, respectively, of the first contact structure, between the two adjacent ones of the gate structures, and an interlayer insulation layer on the plurality of gate structures and contacting the pair of first contact block structures and the first contact structure. An uppermost surface of the first contact structure may be coplanar with uppermost surfaces of the pair of first contact block structures.

DETAILED DESCRIPTION

Various example embodiments will now be described more fully with reference to the accompanying drawings in which some embodiments are shown. However, the inventive concepts may be embodied in many alternate forms and should not be construed as limited only to the embodiments set forth herein.

Figure 1:
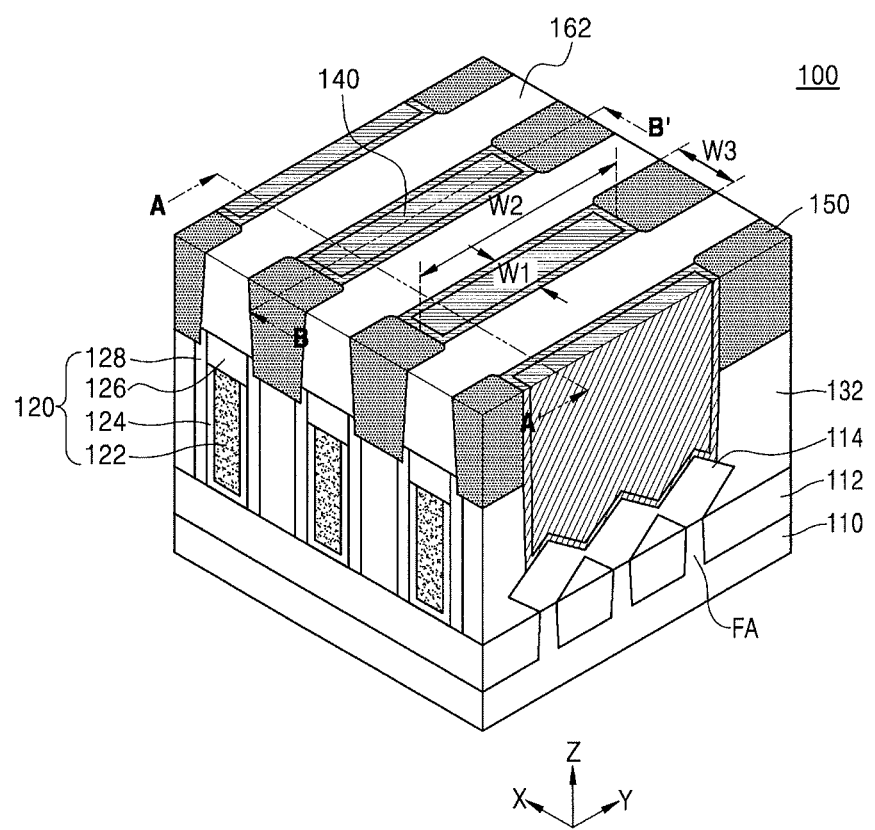
FIG. 1 is a perspective view illustrating an integrated circuit device according to some embodiments.
Figure 2:
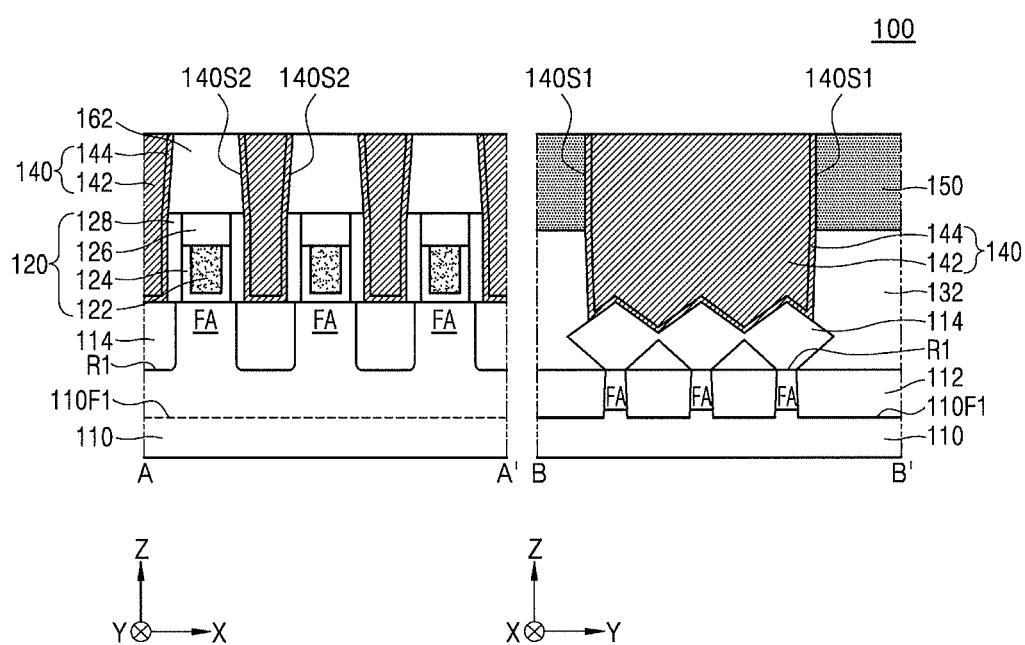
FIG. 2 is a cross-sectional view taken along lines A-A' and B-B' of FIG. 1 according to some embodiments.

FIG. 1 is a perspective view illustrating an integrated circuit device according to some embodiments. FIG. 2 is a cross-sectional view taken along lines A-A' and B-B' of FIG. 1 according to some embodiments.

Referring to FIGS. 1 and 2, an integrated circuit device 100 may include a fin active region FA protruding from an upper surface 110F1 of a substrate 110. The fin active region FA may extend in a first direction X parallel to the upper surface 110F1 of the substrate 110. An isolation layer 112 may be on the substrate 110 and may cover lower portions of opposite sidewalls of the fin active region FA.

In some embodiments, the substrate 110 may include a group IV semiconductor, such as Si or Ge, a group IV-IV compound semiconductor, such as SiGe or SiC, or a group III-V compound semiconductor, such as GaAs, InAs, or InP. The substrate 110 may include a conductive region, e.g., a well doped with an impurity or a structure doped with an impurity. The fin active region FA may be an active region for a PMOS transistor or an NMOS transistor.

A gate structure 120 may be on the fin active region FA and the isolation layer 112 and may extend in a second direction Y parallel to the upper surface 110F1 of the substrate 110. The gate structure 120 may include a gate electrode 122, a gate insulation layer 124, and a gate capping layer 126, and a gate spacer 128.

The gate electrode 122 may include, e.g., doped polysilicon, metal, conductive metal nitride, conductive metal carbide, conductive metal silicide, or a combination thereof. For example, the gate electrode 122 may include, e.g., Al, Cu, Ti, Ta, W, Mo, TaN, NiSi, CoSi, TiN, WN, TiAl, TiAlN, TaCN, TaC, TaSiN, or a combination thereof, but is not limited thereto. In some embodiments, the gate electrode 122 may include a work function metal containing layer and a gap fill metal layer. The work function metal containing layer may include, e.g., at least one metal of Ti, W, Ru, Nb, Mo, Hf, Ni, Co, Pt, Yb, Tb, Dy, Er, and Pd. The gap fill metal layer may include, e.g., W or Al. In some embodiments, the gate electrode 122 may include a stack structure of TiAlC/TiN/W, a stack structure of TiN/TaN/TiAlC/TiN/W, or a stack structure of TiN/TaN/TiN/TiAlC/TiN/W, but is not limited thereto.

The gate insulation layer 124 may be on sidewalls and a lower surface of the gate electrode 122 and may extend in the second direction Y. The gate insulation layer 124 may be between the gate electrode 122 and the fin active region FA and between the gate electrode 122 and an upper surface of the isolation layer 112. The gate insulation layer 124 may include, e.g., silicon oxide, silicon nitride, a high-k dielectric material having a higher dielectric constant than silicon oxide, or a combination thereof. The high-k dielectric material may include metal oxide or metal oxynitride. For example, the gate insulation layer 124 may include a high-k dielectric material, e.g., $HfO_2$, HfSiO, HfSiON, HfTaO, HfTiO, HfZrO, $ZrO_2$, $Al_2O_3$, $HfO_2$— $Al_2O_3$ alloy, or a combination thereof, but is not limited thereto.

The gate capping layer 126 may be on the gate electrode 122. The gate capping layer 126 may cover an upper surface of the gate electrode 122 and may extend in the second direction Y. In some embodiments, the gate capping layer 126 may include, e.g., silicon nitride.

The gate spacer 128 may be on opposite sidewalls of the gate electrode 122 and on opposite sidewalls of the gate capping layer 126. The gate spacer 128 may extend in an extension direction of the gate electrode 122. For example, the gate spacer 128 may extend in the second direction Y. The gate insulation layer 124 may be between the gate spacer 128 and the gate electrode 122. The gate spacer 128 may include, e.g., silicon oxide, silicon nitride, silicon oxynitride, silicon carbonitride, silicon oxycarbonitride, or a combination thereof.

Even though the gate spacer 128 is illustrated as a single layer, embodiments are not limited thereto. In some embodiments, the gate spacer 128 may include multiple layers formed of different materials. For example, the gate spacer 128 may include a first spacer layer, a second spacer layer, and a third spacer layer that are sequentially stacked on the sidewalls of the gate electrode 122. The first spacer layer and the third spacer layer may include, e.g., silicon oxide, silicon oxynitride, or silicon nitride, and the second spacer layer may include a material having a lower dielectric constant than the first spacer layer.

Source/drain regions 114 may be on the fin active region FA at opposite sides of the gate structure 120. Each of the source/drain regions 114 may include a doped SiGe layer, a doped Ge layer, a doped SiC layer, or a doped InGaAs layer, but is not limited thereto. The source/drain regions 114 may be formed by removing a portion of the fin type active region FA at the opposite sides of the gate structure 120 to form recess regions R1 and growing a semiconductor layer filling each of the recess regions R1 by an epitaxy process. In some embodiments, each of the source/drain regions 114 may have a polygonal shape with a plurality of sloped surfaces 114F (refer to FIG. 10A).

When the fin active region FA is an active region for an NMOS transistor, each of the source/drain regions 114 may include a doped SiC layer. When the fin active region FA is an active region for a PMOS transistor, each of the source/drain regions 114 may include a doped SiGe layer. Each of the source/drain regions 114 may include a plurality of semiconductor layers which have different compositions. For example, each of the source/drain regions 114 may include a lower semiconductor layer, an upper semiconductor layer, and a capping semiconductor layer that sequentially fills each of the recess regions R1. The lower semiconductor layer, an upper semiconductor layer, and a capping semiconductor layer may include SiGe and may have different contents of Si and Ge.

As an example, in FIGS. 1 and 2, it is illustrated that three fin active regions FA are sequentially arranged in the second direction Y and the source/drain regions 114 are disposed on the three fin active regions FA to be connected to each other. In this case, the three fin active regions FA may function as an active region for a single unit transistor. However, the example embodiments are not limited thereto. In some embodiments, the source/drain regions 114 on the respective fin active regions FS that are arranged in the second direction Y may not be connected to each other. In this case, one fin active region FA may function as an active region for a single unit transistor.

An inter-gate insulation layer 132 may be between adjacent gate structures 120 to cover a portion of the source/drain regions 114. The inter-gate insulation layer 132 may include, e.g., silicon nitride, silicon oxide, or silicon oxynitride. A first interlayer insulation layer 162 may be on the gate structure 120. The first interlayer insulation layer 162 may include, e.g., silicon oxide.

A first contact structure 140 may be on each of the source/drain regions 114. The first contact structure 140 may be in a first contact hole 140H (refer to FIG. 15A) penetrating the first interlayer insulation layer 162 and the inter-gate insulation layer 132.

The first contact structure 140 may include a first contact plug 142 and a first barrier layer 144. The first barrier layer 144 may surround sidewalls and a lower surface of the first contact plug 142. The first barrier layer 144 may be between the first contact plug 142 and the first interlayer insulation layer 162, between the first contact plug 142 and the inter-gate insulation layer 132, and between the first contact plug 142 and each of the source/drain regions 114. A silicide layer may be optionally between the first barrier layer 144 and each of the source/drain regions 114. The silicide layer may include metal silicide, e.g., titanium silicide or nickel silicide, but is not limited thereto.

The first contact plug 142 may include, e.g., W, Co, Ni, Ru, Cu, Al, silicide thereof, or a combination thereof. The first barrier layer 144 may include, e.g., titanium, titanium nitride, tantalum, tantalum nitride, ruthenium, and/or ruthenium nitride.

In FIGS. 1 and 2, it is illustrated that the first contact structure 140 extends in the second direction Y and vertically (e.g., in a third direction Z) overlaps the three fin active regions FA. However, the first contact structure 140 may overlap one, two, or four or more fin active regions FA and may extend in the second direction Y. The first contact structure 140 may have a rectangular shape in a plan view. In some embodiments, the first contact structure 140 may have various shapes, such as a square shape, a rounded rectangular shape, a rounded square shape, a parallelogram shape, a rhombus shape, in the plan view.

A pair of first contact block structures 150 may be on opposite sidewalls, respectively, of the first contact structure 140 in the second direction Y. The pair of first contact block structures 150 may be spaced apart from each other in the second direction Y. The first contact structure 140 may be between the pair of first contact block structures 150. The pair of first contact block structures 150 may include, e.g., silicon nitride. In some embodiments, the pair of second contact block structures 152 may include a material different from the first interlayer insulation layer 162.

Referring to FIG. 2, the first contact structure 140 may have a pair of first sidewalls 140S1 that are opposite to each other in the second direction Y and a pair of second sidewalls 140S2 that are opposite to each other in the first direction X. Upper portions of the pair of first sidewalls 140S1 of the first contact structure 140 may contact or be adjacent to the pair of first contact block structures 150 (e.g., a sidewall of each of the pair of first contact block structures 150 in the second direction Y). Lower portions of the pair of first sidewalls 140S1 of the first contact structure 140 may contact or be adjacent to the inter-gate insulation layer 132. Upper portions of the pair of second sidewalls 140S2 of the first contact structure 140 may contact or be adjacent to or be covered by the first interlayer insulation layer 162. Lower portions of the pair of second sidewalls 140S2 of the first contact structure 140 may contact or be adjacent to the gate structure 120.

In some embodiments, the first contact structure 140 may have a first width W1 in the first direction X, and each of the pair of first contact block structures 150 may have a third width W3 that is greater than the first width W1 in the first direction X. Thus, the pair of first contact block structures 150 may have sidewalls laterally protruding beyond the second sidewalls 140S2 of the first contact structure 140 in the first direction Y.

In some embodiments, the first contact structure 140 may be a self-aligned contact formed by using a line mask pattern 224 (refer to FIG. 14A) extending in the second direction Y, the pair of first contact block structures 150, and the gate spacer 128, as an etch mask. In an etch process of a first contact hole 140H (refer to FIG. 15A) for forming the first contact structure 140, a portion of the first interlayer insulation layer 162 and a portion of the inter-gate insulation layer 132 that are exposed by the line mask pattern 224 (refer to FIG. 14A) and the pair of first contact block structures 150 may be removed to form the first contact hole 140H (refer to FIG. 15A). Thus, a first width (e.g., first width W1 in the first direction X of the first contact structure 140) of the first contact hole 140H (refer to FIG. 15A) in the first direction X may be determined by the line mask pattern 224 (refer to FIG. 14A). A second width (e.g., second width W2 in the second direction Y of the first contact structure 140) of the first contact hole 140H (refer to FIG. 15A) in the second direction Y may be determined by the pair of first contact block structures 150. Since the first contact hole 140H (refer to FIG. 15A) may be formed in a portion of the first interlayer insulation layer 162 exposed by the pair of first contact block structures 150, between a plurality of line mask patterns 224 that are formed at relatively narrow intervals, the first contact hole 140H (refer to FIG. 15A) may have a relatively small width (e.g., the first width W1 in the first direction X).

Lower surfaces of the pair of first contact block structures 150 may be positioned at a lower level than an upper surface of the gate structure 120, and portions of the pair of first contact block structures 150 may contact or be adjacent to the gate structure 120. Sidewalls of the pair of first contact block structures 150 in the first direction X may contact or be adjacent to or be covered by the first interlayer insulation layer 162. In some embodiments, a lower portion of each of the pair of second sidewalls 140S2 of the first contact structure 140 may contact or be adjacent to a sidewall of the gate spacer 128. In some embodiments, the lower portion of each of the pair of second sidewalls 140S2 of the first contact structure 140 may contact or be adjacent to an upper surface or a sidewall of the gate capping layer 126.

In FIGS. 1 and 2, it is illustrated that each of the pair of first sidewalls 140S1 and the pair of second sidewalls 140S2 of the first contact structure 140 has a flat and continuous profile. However, the example embodiments are not limited thereto. For example, each of the pair of first sidewalls 140S1 and/or the pair of second sidewalls 140S2 of the first contact structure 140 may include multiple portions inclined at different angles with respect to the upper surface of the substrate 110. For example, the upper portion of each of the pair of second sidewalls 140S2 the first contact structure 140 that is positioned at a higher level than the upper surface of the gate structure 120 may be sloped at a different slope from the lower portion thereof that is positioned at a lower level than the upper surface of the gate structure 120. Alternatively, each of the pair of second sidewalls 140S2 of the first contact structure 140 may include a stepped portion that is formed at the same level as the upper surface of the gate structure 120. It may be understood that surfaces that are illustrated as being flat may, in some embodiments, be curved in one or more directions.

The first contact structure 140 may have an upper surface that is coplanar with upper surfaces of the pair of first contact block structures 150. In some embodiments, after forming the pair of first contact block structures 150 that are spaced apart from each other in the second direction Y, the first contact hole 140H (refer to FIG. 15A) may be formed using the line mask pattern 224 (refer to FIG. 14A) extending in the second direction Y and the pair of first contact block structures 150 as an etch mask. Thereafter, a conductive layer may be formed on the pair of first contact block structures 150 to fill the first contact hole 140H (refer to FIG. 15A), and then an upper portion of the conductive layer may be planarized to form the first contact structure 140 remaining in the first contact hole 140H (refer to FIG. 15A). Therefore, the upper surface of the first contact structure 140 may be coplanar with the upper surfaces of the pair of first contact block structures 150.

In general, a width of the gate electrode 122, for example a width of the gate electrode in the first direction X, and a distance between adjacent gate electrodes 122, for example a distance between adjacent gate electrodes in the first direction X, may be reduced depending on a down scaling trend of the integrated circuit device. Thus, the level of difficulty in the process of forming the first contact structure 140 between the gate electrode 122 and the source/drain region 114 may increase. The first contact structure 140 may be formed to have a relatively large contact area with the source/drain region 114 in a confined region between the adjacent gate electrodes 122. For example, an island type contact hole having a relatively narrow width may be formed by forming a linear type line mask pattern extending in the second direction Y, forming a cutting mask pattern extending in the first direction X, and removing an insulating layer exposed commonly by the line mask pattern and the cutting mask pattern. However, the process for forming the cutting mask pattern on the line mask pattern may be performed by complicated multiple process steps.

However, according to the integrated circuit device 100 described above, the first contact hole 140H (refer to FIG. 15A) may be formed by forming the line mask pattern after forming the pair of first contact block structures 150 and using the pair of first contact block structures 150 and the gate spacer 128 as a self-aligned etch mask in the etch process using the line mask pattern. Thus, the first contact structure 140 having a reduced size may be formed by the simplified manufacturing method. Furthermore, since the first contact structure 140 is formed to have a relatively large area by the self-aligned etch process using the pair of first contact block structures 150, the contact area between the first contact structure 140 and the source/drain region 114 may increase such that a reliable electrical connection may be achieved.

Figure 3:
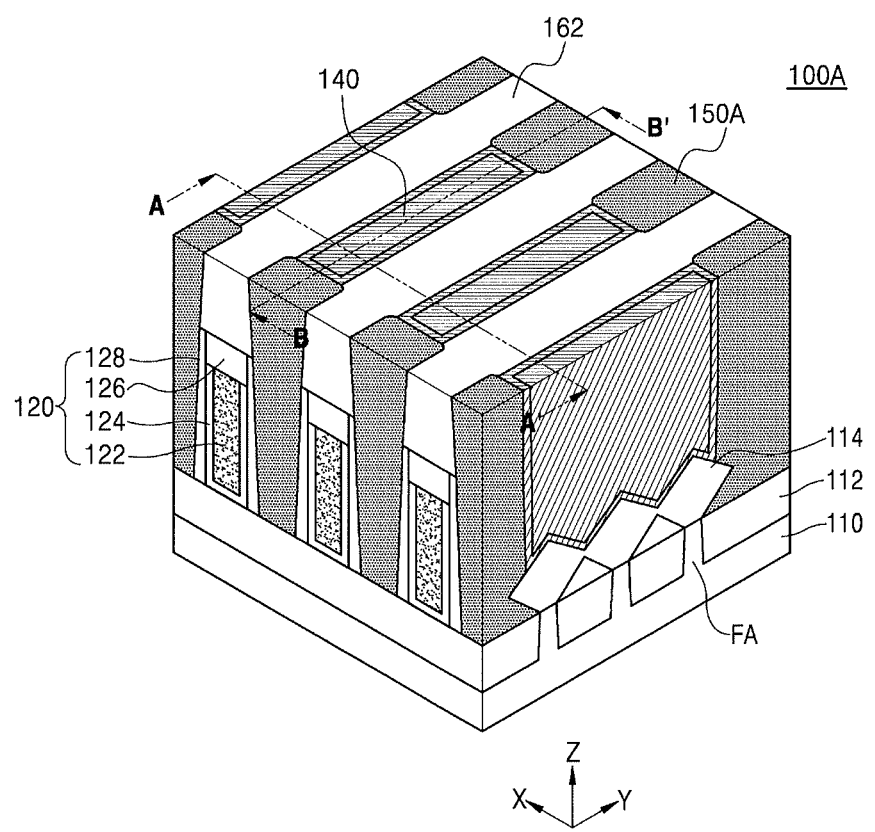
FIG. 3 is a perspective view illustrating an integrated circuit device according to some embodiments.
Figure 4:
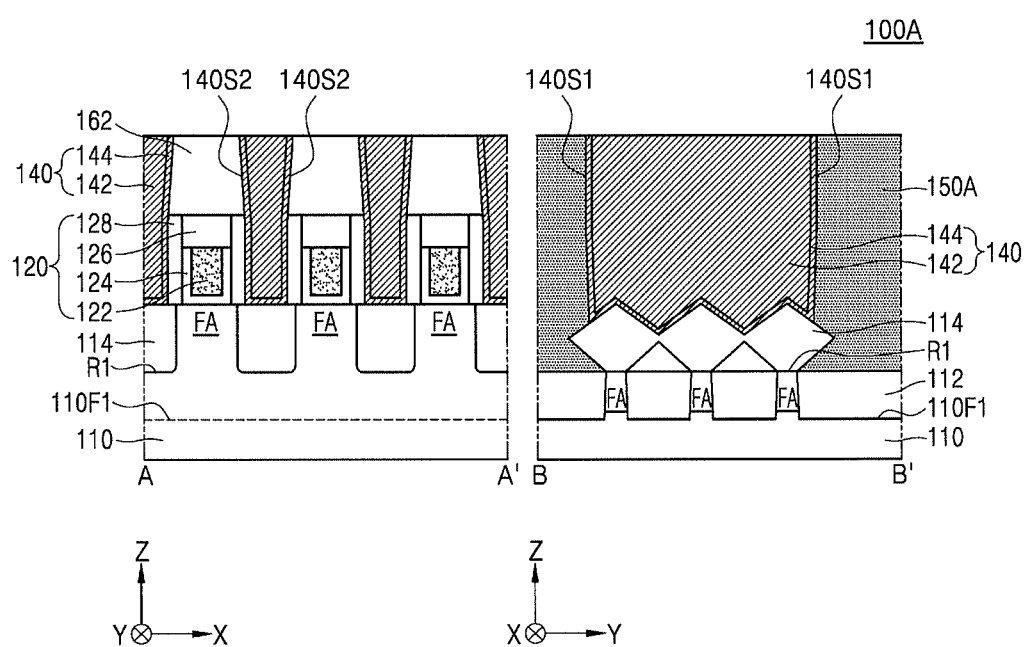
FIG. 4 is a cross-sectional view taken along lines A-A' and B-B' of FIG. 3 according to some embodiments.

FIG. 3 is a perspective view illustrating an integrated circuit device according to some embodiments. FIG. 4 is a cross-sectional view taken along lines A-A' and B-B' of FIG. 3 according to some embodiments. The same reference numerals may be used to denote the same or similar elements as shown in FIGS. 1 and 2 and a description thereof may be omitted for brevity.

Referring to FIGS. 3 and 4, in an integrated circuit device 100A, a pair of first contact block structures 150A may extend in a vertical direction (e.g., the third direction Z) from the upper surface of the first contact structure 140 to a lower surface of the gate structure 120. Lower surfaces of the pair of first contact block structures 150A may be positioned at the same level as the lower surface of the gate structure 120.

The first sidewalls 140S1 of the first contact structure 140 may contact or be adjacent to the pair of first contact block structures 150A (e.g., a sidewall of the pair of first contact block structures 150A in the second direction Y). The pair of first contact block structures 150A may respectively extend from upper portions of the first sidewalls 140S1 of the first contact structure 140 to lower portions of the first sidewalls 140S1 of the first contact structure 140. The lower portions of the second sidewalls 140S2 of the first contact structure 140 may contact or be adjacent to the gate spacer 128, and the upper portions of the second sidewalls 140S2 of the first contact structure 140 may contact or be adjacent to or be covered by the first interlayer insulation layer 162. The pair of first contact block structures 150A may contact or be adjacent to some of the source/drain regions 114. Each of the pair of first contact block structures 150A may have a sidewall in the first direction X, which contacts or is covered by the first interlayer insulation layer 162. Accordingly, some embodiments may not include the inter-gate insulation layer 132 between the first contact block structures 150A and the isolation layer 112.

According to some embodiments, the pair of first contact block structures 150A may be formed to be spaced apart from each other in the second direction Y, and then the first contact hole 140H (refer to FIG. 15A) may be formed using the line mask pattern 224 (refer to FIG. 14A) extending in the second direction Y as an etch mask. A width of the first contact hole 140H (refer to FIG. 15A) in the first direction X may be defined by adjacent line mask patterns 224 (refer to FIG. 14A), and a width of the first contact hole 140H (refer to FIG. 15A) in the second direction Y may be defined by the pair of first contact block structures 150A. Since the pair of first contact block structures 150A have the lower surfaces coplanar with the lower surface of the gate structure 120, an etch selectivity in the etch process for forming the first contact hole 140H (refer to FIG. 15A) may increase, and damages of the gate spacer 128 in the etch process for forming the first contact hole 140H (refer to FIG. 15A) may be prevented.

According to some embodiments, since the pair of first contact block structures 150A and the gate spacer 128 may serve as a self-aligned etch mask in the etch process using the line mask pattern, the first contact structure 140 having a reduced size may be formed by a simplified manufacturing method. In addition, since the first contact structure 140 may be formed to have a relatively large area by the self-aligned etch process using the gate spacer 128 and the pair of first contact block structures 150A, a contact area between the first contact structure 140 and the source/drain region 114 may increase such that a reliable electrical connection may be achieved.

Figure 5:
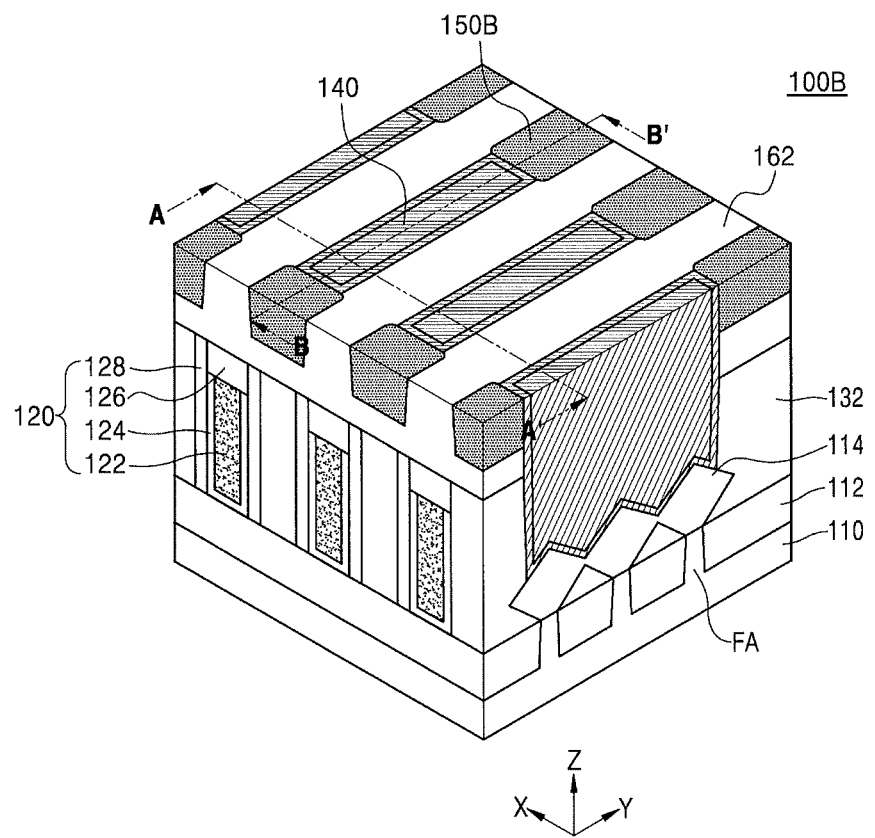
FIG. 5 is a perspective view illustrating an integrated circuit device according to some embodiments.
Figure 6:
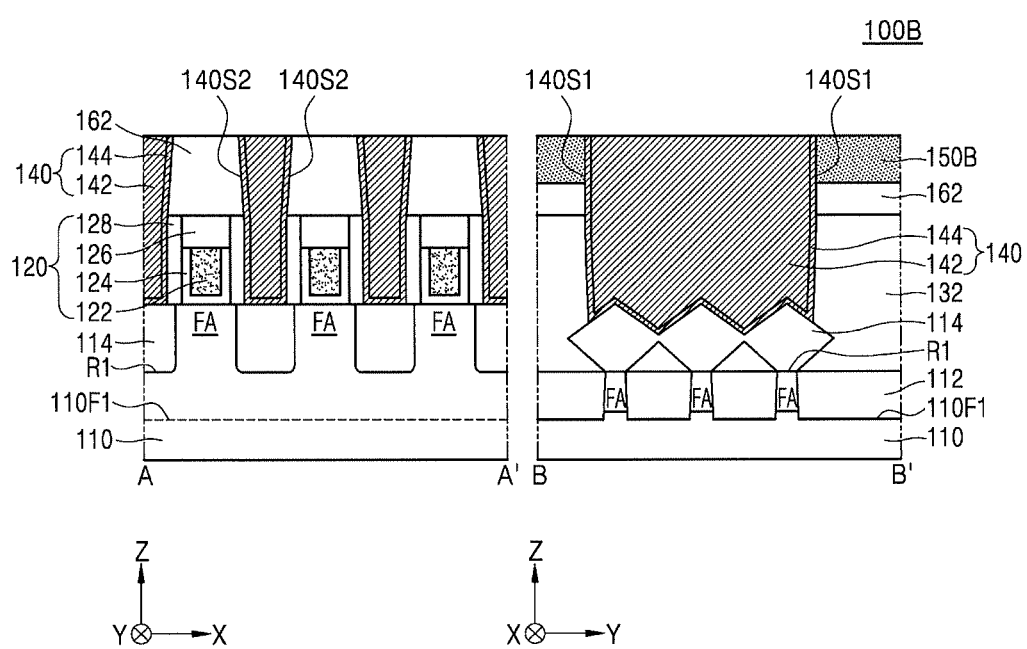
FIG. 6 is a cross-sectional view taken along lines A-A' and B-B' of FIG. 5 according to some embodiments.

FIG. 5 is a perspective view illustrating an integrated circuit device according to some embodiments. FIG. 6 is a cross-sectional view taken along lines A-A' and B-B' of FIG. 5 according to some embodiments. The same reference numerals may be used to denote the same elements as shown in FIGS. 1 to 4 and a description thereof may be omitted for brevity.

Referring to FIGS. 5 and 6, in an integrated circuit device 100B, a pair of first contact block structures 150B may have upper surfaces that are coplanar with the upper surface of the first contact structure 140 and lower surfaces positioned at a higher level than the upper surface of the gate structure 120. The pair of first contact block structures 150B may not directly contact the gate structure 120, and sidewalls and lower surfaces of the pair of first contact block structures 150B may be covered by the first interlayer insulation layer 162. In other words, portions of the first interlayer insulation layer 162 may be between the pair of first contact block structures 150B and the inter-gate insulation layer 132.

Upper portions of the first sidewalls 140S1 of the first contact structure 140 may contact or be adjacent to the pair of first contact block structures 150B (e.g., sidewalls of the pair of first contact block structures 150B in the second direction Y). Middle portions of the first sidewalls 140S1 of the first contact structure 140 may contact or be adjacent to the first interlayer insulation layer 162. Lower portions of the first sidewalls 140S1 of the first contact structure 140 may contact or be adjacent to the inter-gate insulation layer 132.

According to some embodiments, portions of the first interlayer insulation layer 162 may be removed and then the pair of first contact block structures 150B that are spaced apart from each other in the second direction Y may be formed in the removed portions of the first interlayer insulation layer 162. The pair of first contact block structures 150B may be formed above the gate structure 120 not to contact the upper surface of the gate structure 120. Thereafter, the first contact hole 140H (refer to FIG. 15A) may be formed by performing an anisotropic etching process using the pair of first contact block structures 150B and the line mask pattern 224 (refer to FIG. 14A) extending in the second direction Y, as an etch mask. In the etch process for forming the pair of first contact block structures 150B, the gate structure 120 may be covered by the first interlayer insulation layer 162 not to be exposed, such that the gate spacer 128 may be prevented from being damaged.

According to some embodiments, since the pair of first contact block structures 150B and the gate spacer 128 may be used as a self-aligned etch mask in the etch process using the line mask pattern, the first contact structure 140 having a reduced size may be formed by a simplified manufacturing method. In addition, since the first contact structure 140 may be formed to have a relatively large area by the self-aligned etch process using the gate spacer 128 and the pair of first contact block structures 150B, a contact area between the first contact structure 140 and the source/drain region 114 may increase such that a reliable electrical connection may be obtained.

Figure 7:
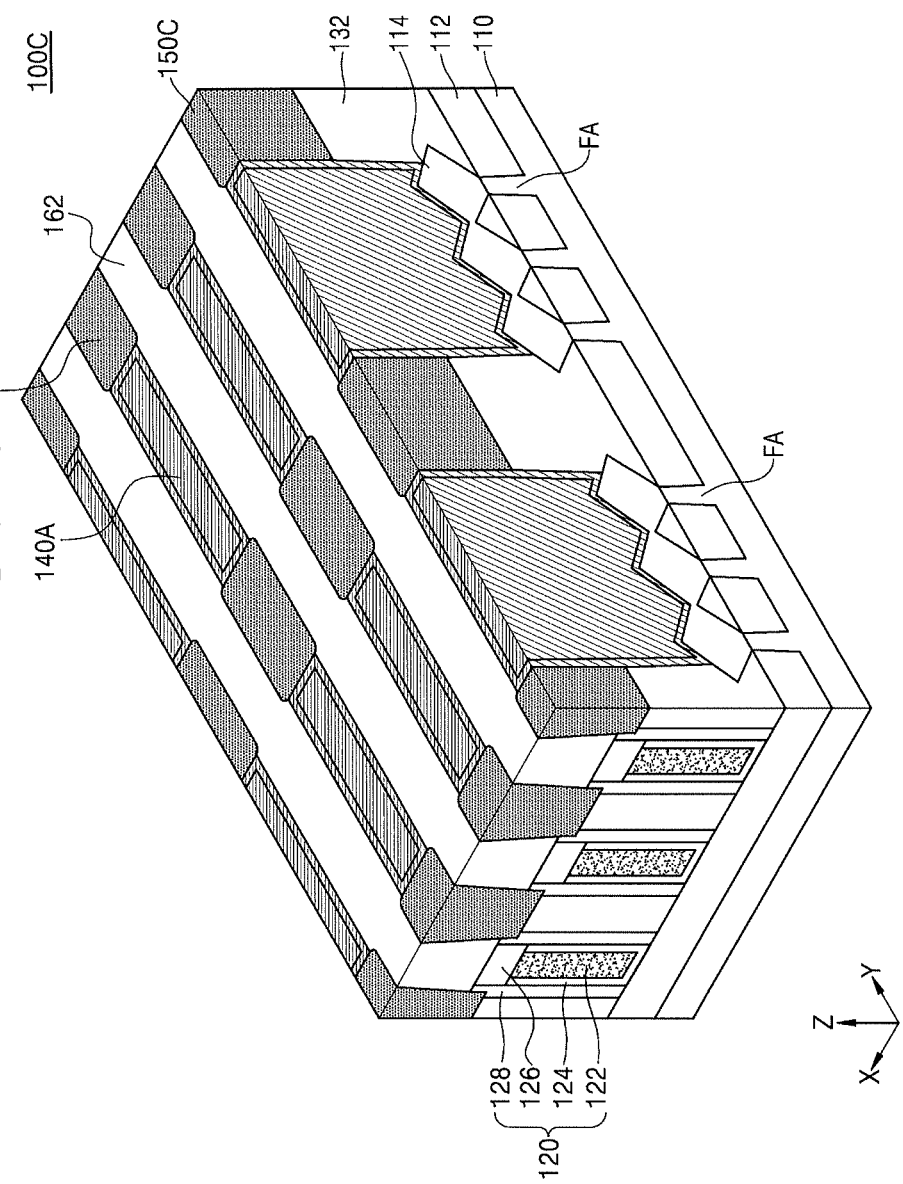
FIG. 7 is a perspective view illustrating an integrated circuit device according to some embodiments.

FIG. 7 is a perspective view illustrating an integrated circuit device according to some embodiments. The same reference numerals are used to denote the same elements as shown in FIGS. 1 to 6 and a description thereof may be omitted for brevity.

Referring to FIG. 7, in an integrated circuit device 100C, a plurality of gate structures 120 extending in the second direction Y may be on a plurality of fin active regions FA extending in the first direction X. Each of the gate electrodes 122 may be disposed between two adjacent source/drain regions 114.

A plurality of first contact structures 140A may be on the source/drain regions 114. The plurality of first contact structures 140A may be spaced apart from each other in the first direction X and the second direction Y. A plurality of first contact block structures 150C may be arranged in the first direction Y and the second direction X. Each of the plurality of first contact structures 140A may be between two adjacent first contact block structures 150C in the second direction Y. The first contact structures 140A may directly contact sidewalls of adjacent ones of the plurality of first contact block structures 150C. The first interlayer insulation layer 162 may be between the plurality of first contact structures 140A and between the plurality of first contact block structures 150C in the first direction X. Features of the plurality of first contact structures 140A and the plurality of first contact block structures 150C may be the same as or similar to those described with reference to FIGS. 1 to 6 and a description thereof may be omitted for brevity.

In some embodiments, in a plan view, ones of the plurality of first contact structures 140A and ones of the plurality of first contact block structures 150C may be alternately arranged in the second direction Y, between adjacent gate structures 120.

According to some embodiments, the plurality of first contact block structures 150C may be formed spaced apart from each other in the first direction X and the second direction Y. The plurality of first contact block structures 150C may be formed by forming island type first openings 150H (refer to FIG. 12A) that are spaced apart from each other in the first direction X and the second direction Y and filling the first openings 150H (refer to FIG. 12A) with silicon nitride. Thereafter, the first contact holes 140H (refer to FIG. 15A) may be formed using the line mask pattern 224 (refer to FIG. 14A) extending in the second direction Y and the plurality of first contact block structures 150C as an etch mask. A width of ones of the first contact holes 140H in the first direction X may be defined by a distance between adjacent line mask patterns 224 (refer to FIG. 14A). A width of the first contact holes 140H in the second direction Y may be defined by a distance between adjacent first contact block structures 150C in the second direction Y. A conductive layer may be formed to fill the first contact holes 140H (refer to FIG. 15A), and then an upper portion of the conductive layer may be planarized, such that the plurality of first contact structures 140A may remain in the first contact holes 140H (refer to FIG. 14A), respectively. The plurality of first contact structures 140A, which have reduced size, may be formed by a simplified manufacturing method.

Figure 8:
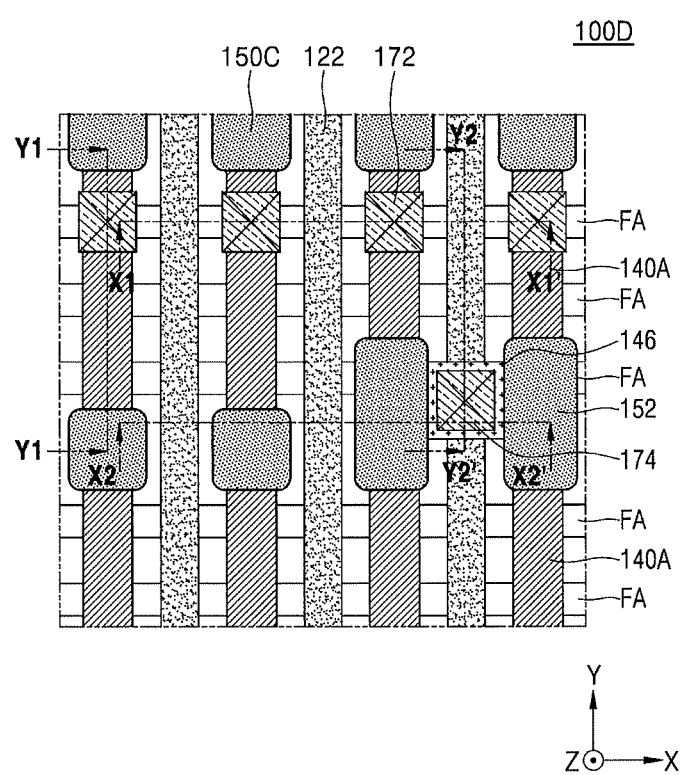
FIG. 8 is a layout diagram illustrating an integrated circuit device according to some embodiments.
Figure 9A:
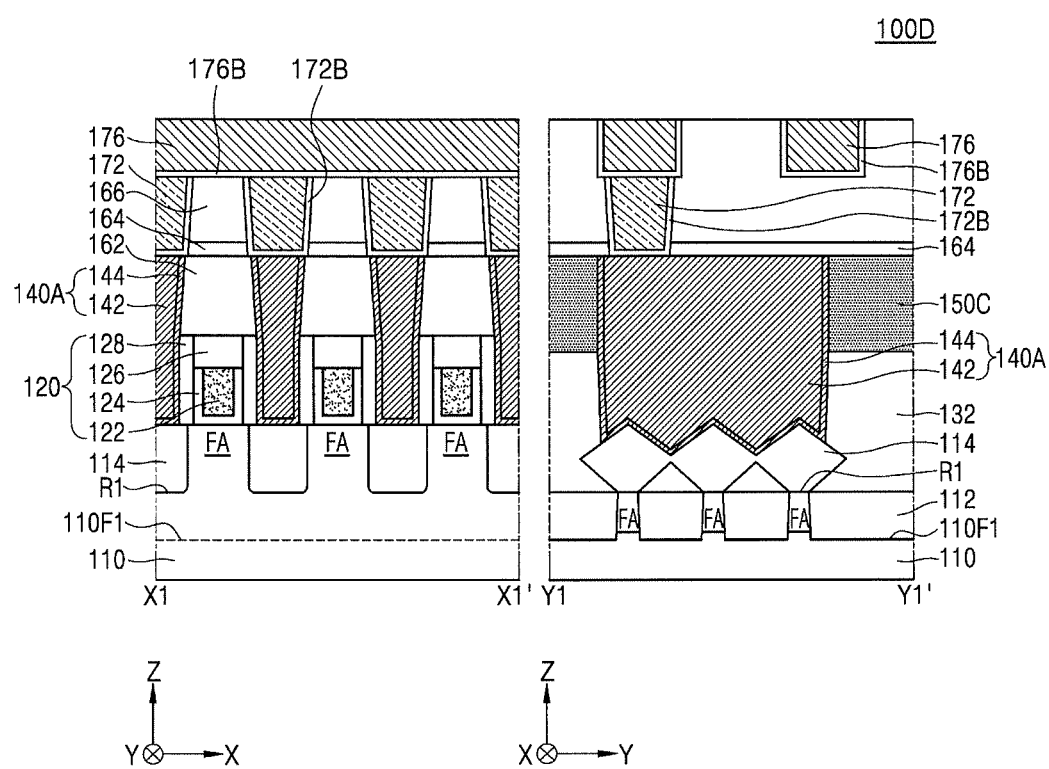
FIG. 9A is a cross-sectional view taken along lines X1-X1' and Y1-Y1' of FIG. 8 according to some embodiments.
Figure 9B:
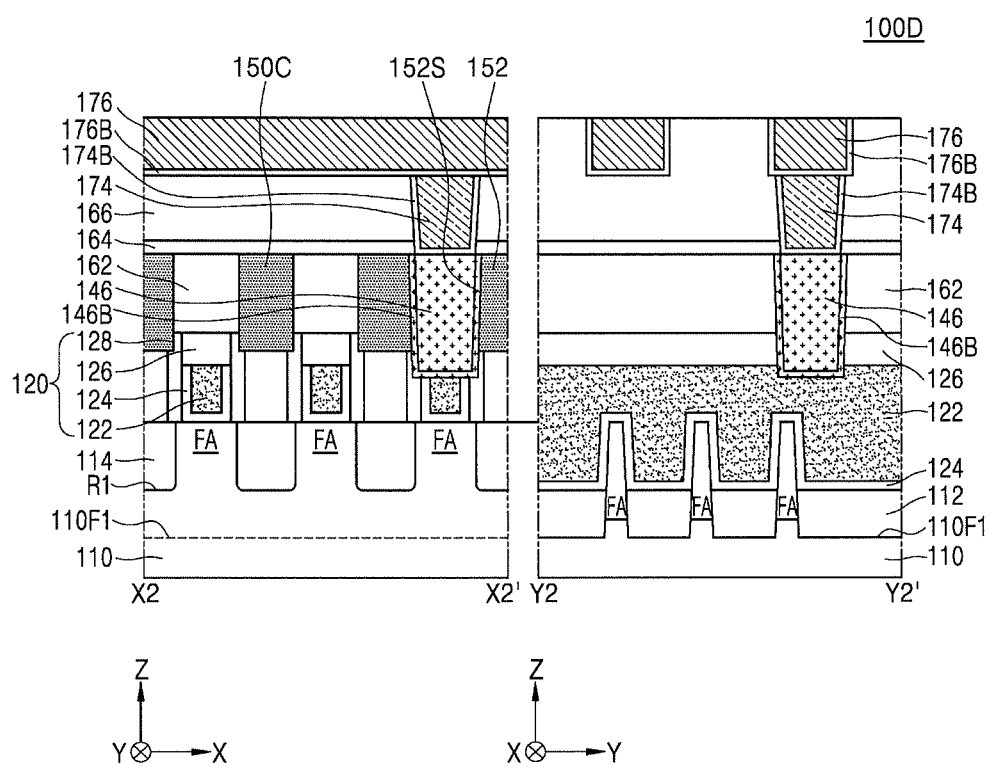
FIG. 9B is a cross-sectional view taken along lines X2-X2' and Y2-Y2' of FIG. 8 according to some embodiments.

FIG. 8 is a layout diagram illustrating an integrated circuit device according to some embodiments. FIG. 9A is a cross-sectional view taken along lines X1-X1' and Y1-Y1' of FIG. 8 according to some embodiments. FIG. 9B is a cross-sectional view taken along lines X2-X2' and Y2-Y2' of FIG. 8 according to some embodiments. FIG. 8 illustrates some elements of an integrated circuit device 100D for convenience. The same reference numerals are used to denote the same or similar elements as shown in FIGS. 1 to 7 and a description thereof may be omitted for brevity.

Referring to FIGS. 8, 9A, and 9B, in an integrated circuit device 100D, a plurality of gate structures 120 extending in the second direction Y may be on a plurality of fin active regions FA extending in the first direction X. Each of the gate electrodes 122 may be between two adjacent source/drain regions 114.

A plurality of first contact structures 140A may be on the source/drain regions 114. The plurality of first contact structures 140A may be spaced apart from each other in the first direction X and the second direction Y. Ones of the plurality of first contact structures 140A and ones of a plurality of first contact block structures 150C may be alternately arranged in the second direction Y, between adjacent gate structures 120.

A second contact structure 146 may be on one of the gate structures 120. The second contact structure 146 may be electrically connected to the gate electrode 122. A second barrier layer 146B may cover sidewalls and a lower surface of the second contact structure 146. The second barrier layer 146B may include the same material as the first barrier layer 144.

A pair of second contact block structures 152 may be on opposite sidewalls, respectively, of the second contact structure 146 in the first direction X. The pair of second contact block structures 152 may include, e.g., silicon nitride. In some embodiments, the pair of second contact block structures 152 may include a material different from the first interlayer insulation layer 162.

The pair of second contact block structures 152 may be spaced apart from each other with the second contact structure 146 therebetween in the first direction X. The pair of second contact block structures 152 may contact or be adjacent to the first contact structure 140A. In some embodiments, the pair of second contact block structures 152 may not contact the first contact structure 140A.

Upper surfaces of the pair of second contact block structures 152 may be coplanar with an upper surface of the second contact structure 146. In some embodiments, the pair of second contact block structures 152 may be formed to be spaced apart from each other in the first direction X, and then a second contact hole 146H (refer to FIG. 18A) may be formed using a mask pattern 234 (refer to FIG. 18B) and the pair of second contact block structures 152 as an etch mask. A width of the second contact hole 146H (refer to FIG. 18A) in the second direction Y may be defined by adjacent mask patterns 234 (refer to FIG. 18B), and a width of the second contact hole 146H (refer to FIG. 18A) in the first direction X may be defined by the pair of second contact block structures 152. Thereafter, a conductive layer may be formed to fill the second contact hole 146H (refer to FIG. 18A), and then an upper portion of the conductive layer may be planarized such that the second contact structure 146 may remain in the second contact hole 146H (refer to FIG. 18A). Thus, the upper surface of the second contact structure 146 may be coplanar with the upper surfaces of the pair of second contact block structures 152.

An etch stop layer 164 may be on the first contact structures 140A, the first contact block structures 150C, the second contact block structures 152, and the first interlayer insulation layer 162. A second interlayer insulation layer 166 may be on the etch stop layer 164. The etch stop layer 164 may include a material having an etch selectivity with respect to the second interlayer insulation layer 166, e.g., silicon nitride, silicon oxynitride, or aluminum oxide. The second interlayer insulation layer 166 may include, e.g., silicon oxide, a TEOS layer, or an ultra-low-k dielectric material having a low dielectric constant of about 2.2 to about 2.4.

A plurality of first vias 172 may be respectively connected to ones of the first contact structures 140A. Sidewalls and a lower surface of each of the first vias 172 may be surrounded by a third barrier layer 172B. A second via 174 may be connected to the second contact structure 146. Sidewalls and a lower surface of the second via 174 may be surrounded by a fourth barrier layer 174B.

In some embodiments, the first vias 172 and the second via 174 may include substantially the same material as the first contact plug 142. The third barrier layer 172B and the fourth barrier layer 174B may include substantially the same material as the first barrier layer 144.

An upper wiring layer 176 may be on the first via 172 and the second via 174. A fifth barrier layer 176B may be to surround sidewalls and a lower surface of the upper wiring layer 176. The second interlayer insulation layer 166 may surround the sidewalls of the first via 172, the second via 174, and the upper wiring layer 176. In the drawings, it is illustrated that each of the upper wiring layer 176 and the second interlayer insulation layer 166 is formed of a single layer. However, in some embodiments, the upper wiring layer 176 may include a stack structure of a plurality of wiring layers that are positioned at different levels, and the second interlayer insulation layer 166 may include a stack structure of a plurality of insulation layers, each of which surrounds a plurality of wiring layers.

According to some embodiments, since the first contact structure 140A and the second contact structure 146 may be formed using the plurality of first contact block structures 150C and the pair of second contact block structures 152 as a self-aligned mask, the first contact structures 140A and the second contact structure 146 may be formed to have a reduced size by a simplified manufacturing method. In addition, a contact area between the first contact structure 140A and the source/drain region 114 may increase such that a reliable electrical connection may be obtained.

FIGS. 10A, 10B, 11A, 11B, 12A, 12B, 13A, 13B, 14A, 14B, 15A, 15B, 16A, 16B, 17A, 17B, 18A, 18B, 19A, and 19B are cross-sectional views illustrating operations of methods of manufacturing an integrated circuit device 100D according to some embodiments. FIGS. 10A, 11A, 12A, 13A, 14A, 15A, 16A, 17A, 18A, and 19A are cross-sectional views taken along lines X1-X1' and Y1-Y1' of FIG. 8 according to some embodiments. FIGS. 10B, 11B, 12B, 13B, 14B, 15B, 16B, 17B, 18B, and 19B are cross-sectional views taken along lines X2-X2' and Y2-Y2' of FIG. 8 according to some embodiments. The same reference numerals nay be used to denote the same elements as shown in FIGS. 1 to 9B and descriptions thereof may be omitted for brevity.

Figure 10A:
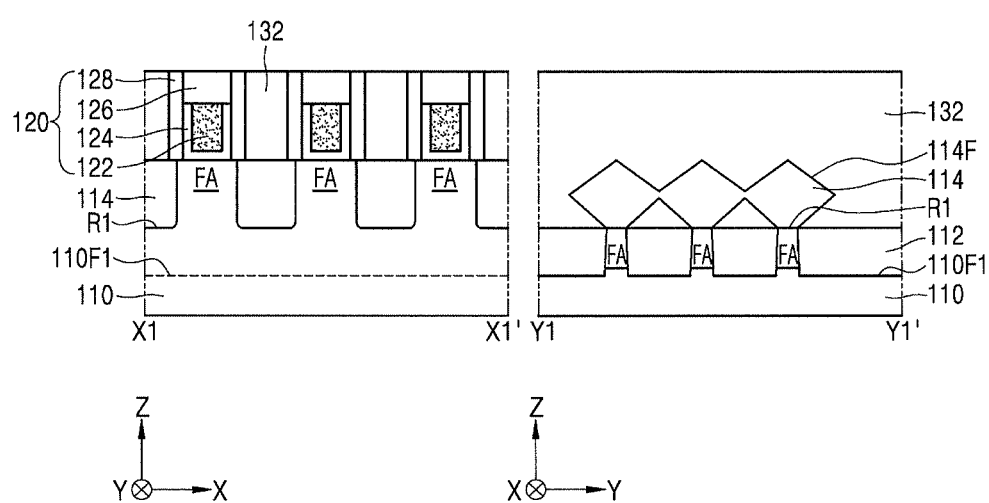
FIGS. 10A, 10B, 11A, 11B, 12A, 12B, 13A, 13B, 14A, 14B, 15A, 15B, 16A, 16B, 17A, 17B, 18A, 18B, 19A, and 19B are cross-sectional views illustrating operations of methods of manufacturing integrated circuit devices according to some embodiments.
Figure 10B:
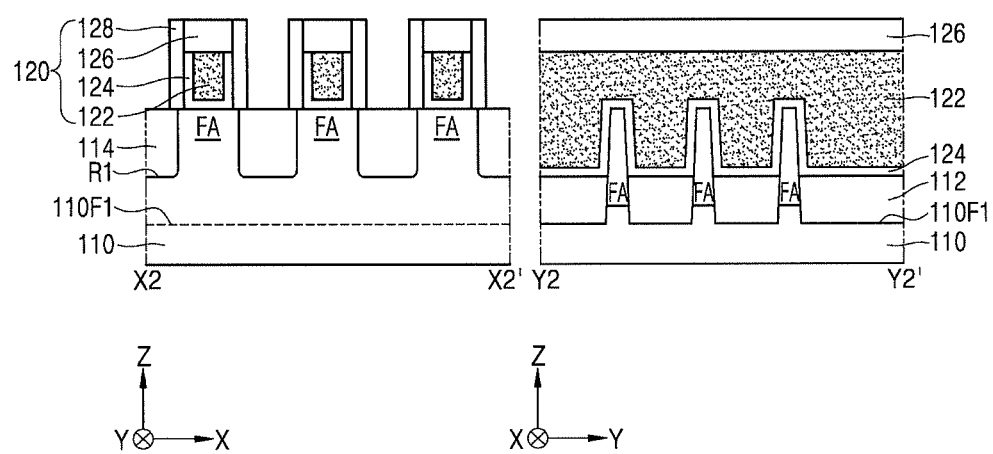

Referring to FIGS. 10A and 10B, a portion of an active region of the substrate 110 may be etched to form the first fin active regions FA vertically protruding from the upper surface 110F1 of the substrate 110 and extending in the first direction X The isolation layer 112 may be formed on the substrate 110 to cover opposite sidewalls of the fin active regions FA. An interfacial layer may be further formed between the isolation layer 112 and the fin active regions FA to conformally cover the sidewalls of the fin active regions FA.

Sacrificial gate structures extending in the second direction Y may be formed on the substrate 110. For example, the sacrificial gate structures may be formed by sequentially forming sacrificial gate insulation patterns, sacrificial gates, and hard mask patterns, forming an insulation layer by an atomic layer deposition process or a chemical vapor deposition process to cover the hard mask patterns, the sacrificial gates, and the sacrificial gate insulation patterns, and performing an anisotropic etch process to form the gate spacers 128 on sidewalls of the hard mask patterns, the sacrificial gates, and the sacrificial insulation patterns. The sacrificial gate insulation patterns, the sacrificial gates, the hard mask patterns, and the gate spacers 128 may constitute the sacrificial gate structures. The gate spacers 128 may include, e.g., silicon nitride, but are not limited thereto.

Portions of the fin active regions FA at opposite sides of the sacrificial gate structures may be removed to form the recess regions R1. The source/drain regions 114 may be formed in the recess regions R1, respectively.

In some embodiments, the source/drain regions 114 may be formed by an epitaxy process using the fin active regions FA exposed by the recess regions R1 as a seed. The epitaxy process may include vapor-phase epitaxy, ultra-high vacuum chemical vapor deposition, molecular beam epitaxy, or a combination thereof. In the epitaxy process, a liquid precursor or a vapor precursor may be used.

The source/drain regions 114 may be formed to have various shapes by controlling a growth condition in the epitaxy process. For example, each of the source/drain regions 114 may have a polygonal shape in which sloped surfaces 114F inclined at a predetermined angle with respect to the upper surface 110F1 of the substrate 110 are connected to each other, but is not limited thereto. The shape of each of the source/drain regions 114 may be variously changed depending on a material of the fin active regions FA, a material of the source/drain regions 114, a kind of a transistor formed on the substrate 110, and conditions in the epitaxy process.

An insulation layer may be formed on the substrate 110 to cover the sacrificial gate structures, and then may be planarized until exposing upper surfaces of the hard mask patterns to form the inter-gate insulation layer 132.

Then, the hard mask patterns, the sacrificial gates, the sacrificial gate insulation patterns may be removed, and the gate insulation layer 124 may be formed on inner sidewalls of pairs of gate spacers 128 and on the fin active regions FA. A conductive layer may be formed on the gate insulation layer 124 to fill a space between the pairs of gate spacers 128, and then an upper portion of the conductive layer may be etched back to form the gate electrodes 122. Then, an insulation layer may be formed on the gate electrodes 122 and the inter-gate insulation layer 132 to fill a remaining space between the pairs of gate spacers 128, and an upper portion of the insulation layer may be removed to form the gate capping layers 126. Therefore, the gate structures 120 including the gate insulation layer 124, the gate electrodes 122, the gate capping layers 126, and the gate spacers 128 may be formed.

In some embodiments, the removal of the hard mask patterns, the sacrificial gates, and the sacrificial patterns may be performed by a wet etch process. The wet etch process may be performed using an etchant, e.g., $HNO_3$, diluted fluoric acid (DHF), $NH_4OH$, tetramethyl ammonium hydroxide (TMAH), KOH, or a combination thereof.

Figure 11A:
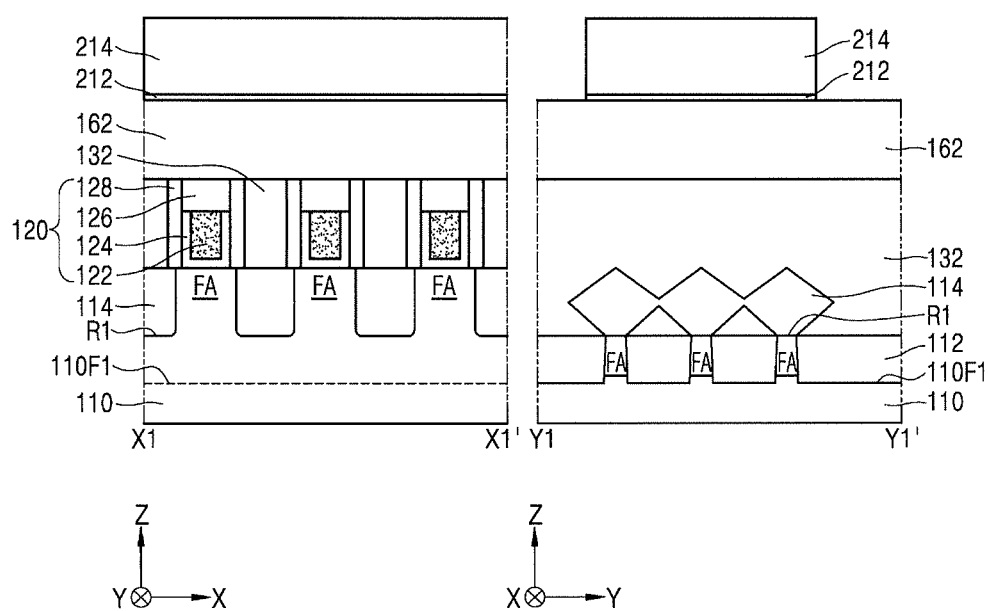
Figure 11B:
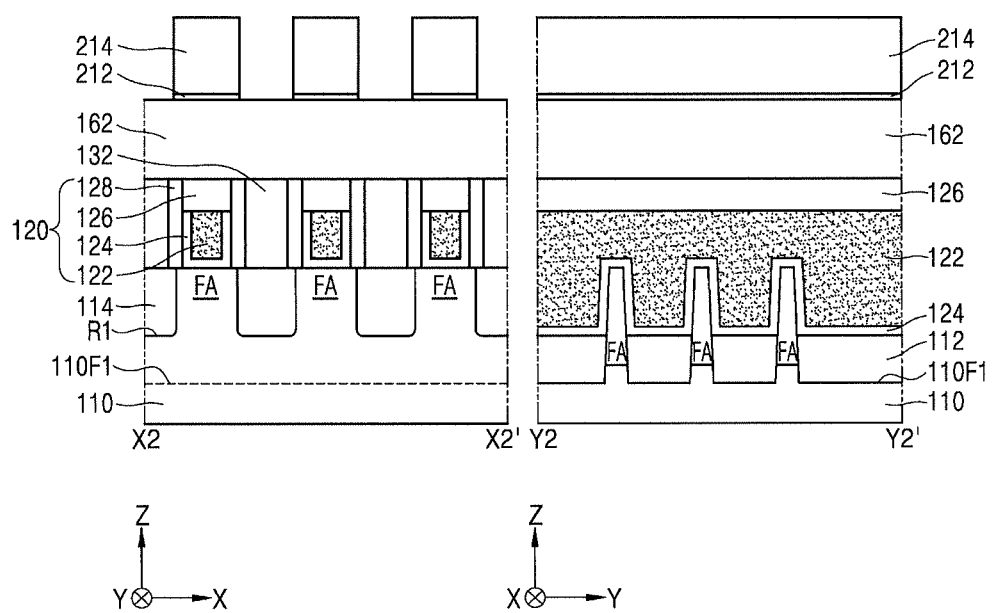

Referring to FIGS. 11A and 11B, the first interlayer insulation layer 162 may be formed on the gate structures 120 and the inter-gate insulation layer 132. A first lower material pattern 212 and a first mask pattern 214 may be formed on the first interlayer insulation layer 162. In some embodiments, the first lower material pattern 212 may include, e.g., silicon oxynitride, silicon nitride, or silicon oxide. The first mask pattern 214 may include a material having an etch selectivity to the first lower material pattern 212 among silicon oxynitride, silicon nitride, and silicon oxide.

Figure 12A:
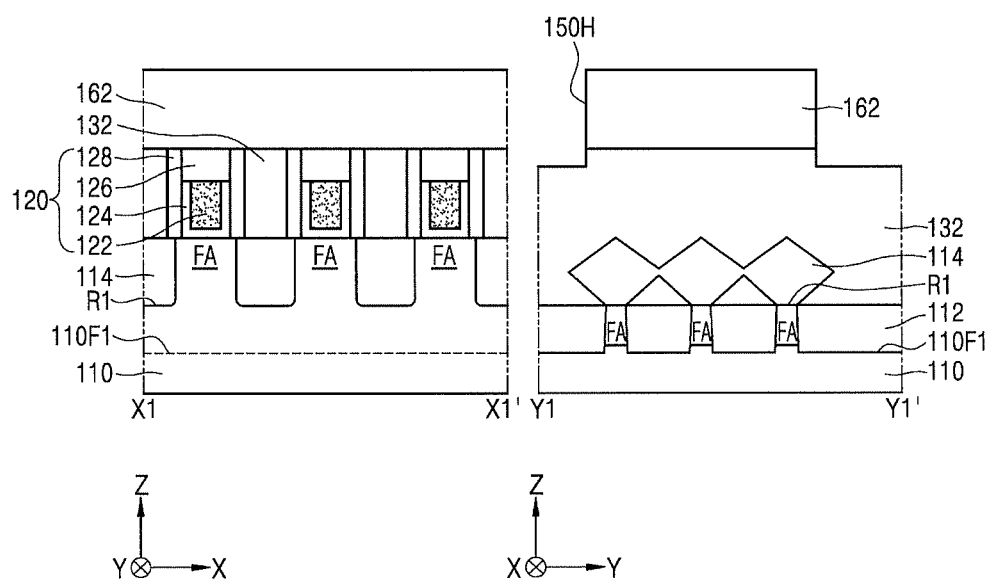
Figure 12B:
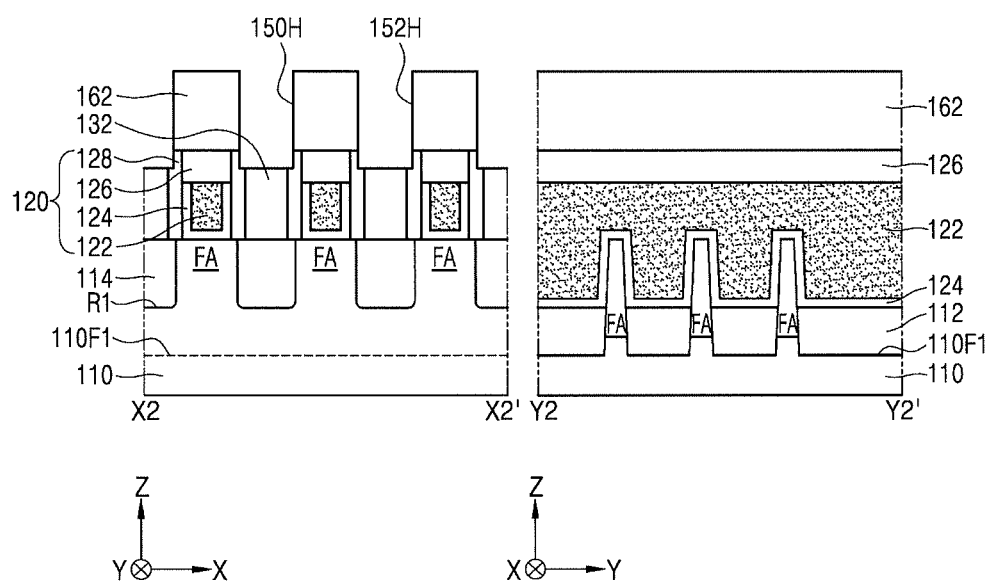

Referring to FIGS. 12A and 12B, a portion of the first interlayer insulation layer 162 and a portion of the inter-gate insulation layer 132 may be removed using the first lower material pattern 212 and the first mask pattern 214 as an etch mask, to faun a plurality of first openings 150H and a pair of second openings 152H. In the etch process of the plurality of first openings 150H and the pair of second openings 152H, a portion of the gate structures 120 may also be removed. As shown in FIG. 12B, a portion of the gate structures 120, e.g., a portion of the gate spacers 128 may be exposed on lower surfaces of the plurality of first openings 150H and the pair of second openings 152H. In addition, stepped portions may be formed at upper portions of the gate spacers 128 by removing the portion of the gate spacers 128.

Thereafter, the first lower material pattern 212 and the first mask pattern 214 may be removed.

Figure 13A:
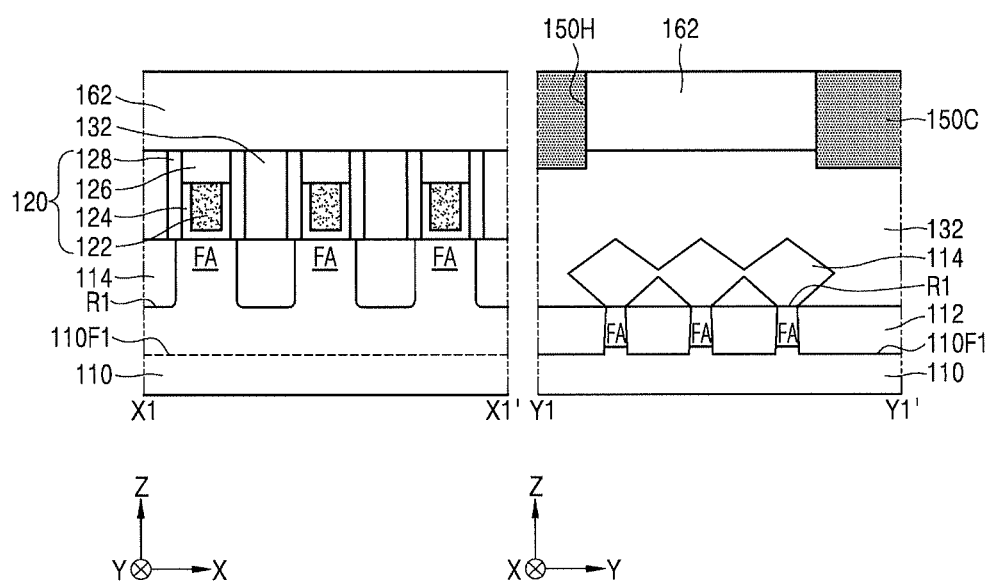
Figure 13B:
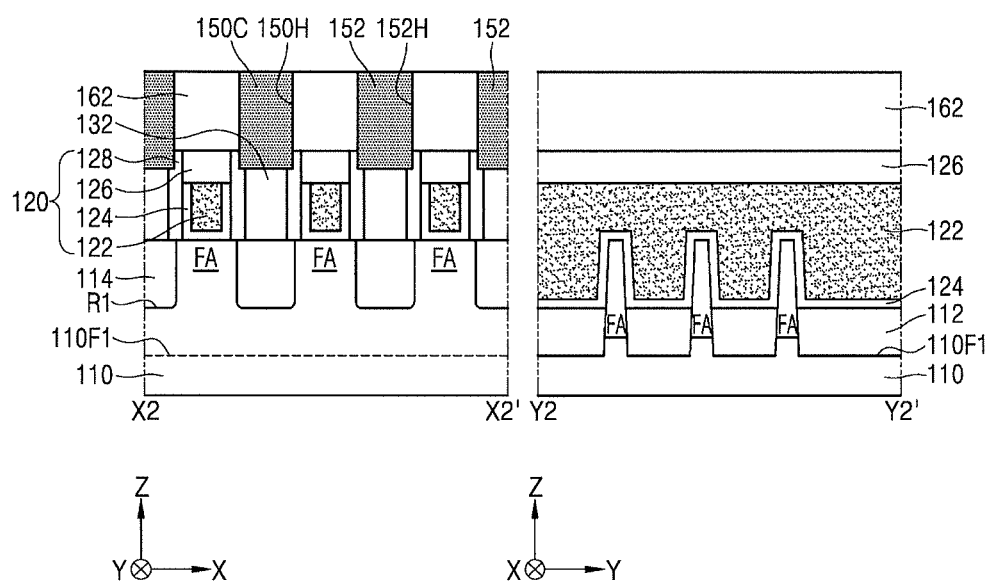

Referring to FIGS. 13A and 13B, an insulation layer (e.g., a silicon nitride layer) may be formed on the first interlayer insulation layer 162 and the inter-gate insulation layer 132 to fill the plurality of first openings 150H and the pair of second openings 152H, and then an upper portion of the insulation layer may be planarized until exposing the upper surface of the first interlayer insulation layer 162, to form the plurality of first contact block structures 150C in the plurality of first openings 150H, respectively, and to form the pair of second contact block structures 152 in the pair of second openings 152H, respectively.

Figure 14A:
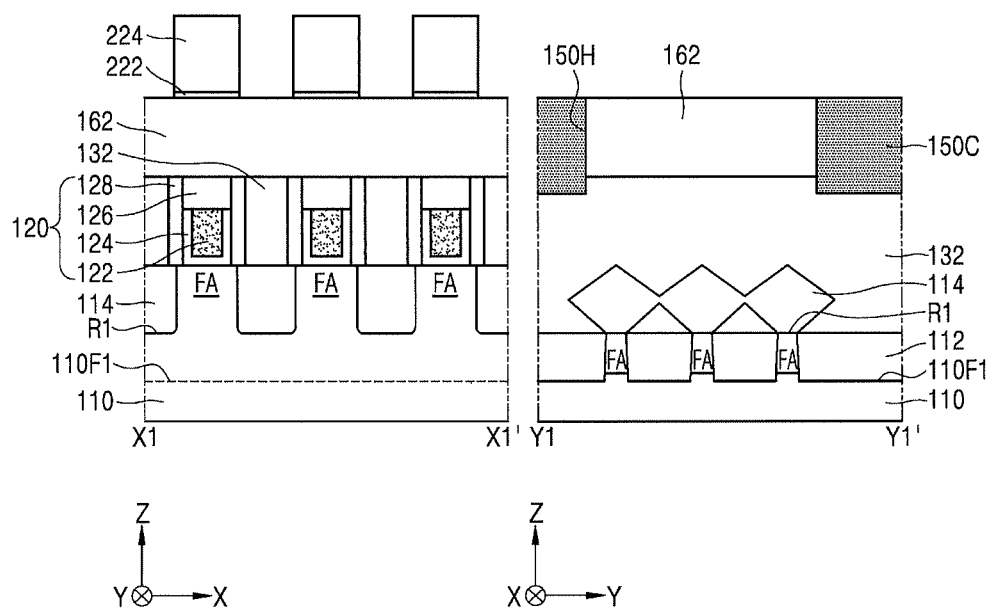
Figure 14B:
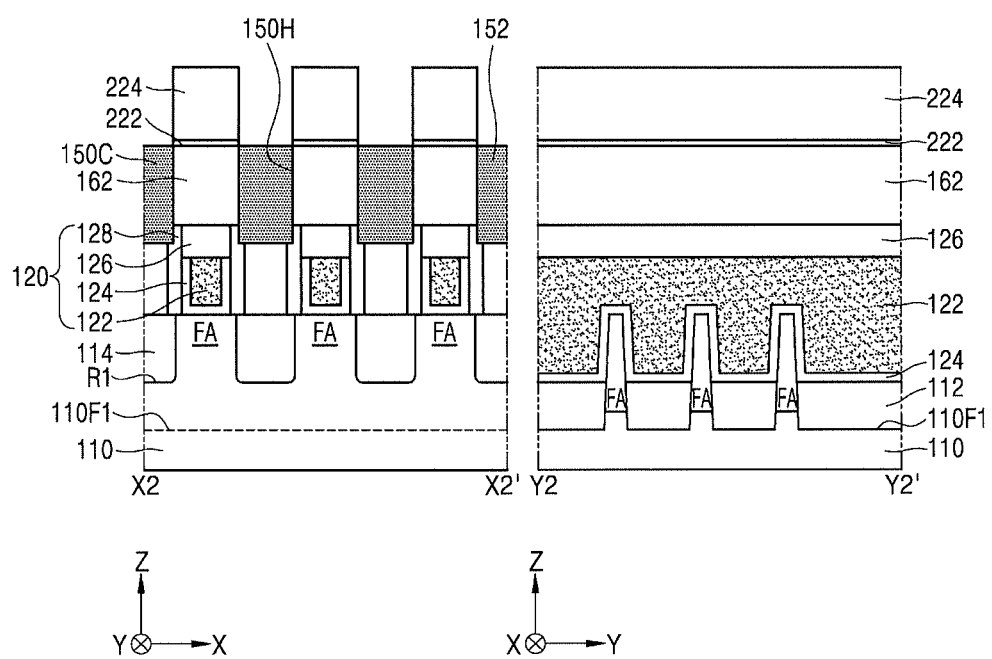

Referring to FIGS. 14A and 14B, a second lower material pattern 222 and the line mask pattern 224, both extending in the second direction Y, may be formed on the plurality of first contact block structures 150C, the pair of second contact block structures 152, and the first interlayer insulation layer 162.

In some embodiments, the second lower material pattern 222 may include, e.g., silicon oxynitride, silicon nitride, or silicon oxide. The line mask pattern 224 may include a material having an etch selectivity with respect to the second lower material pattern 222 among silicon oxynitride, silicon nitride, spin on hardmask (SOH), spin on dielectric (SOD), and silicon oxide.

Figure 15A:
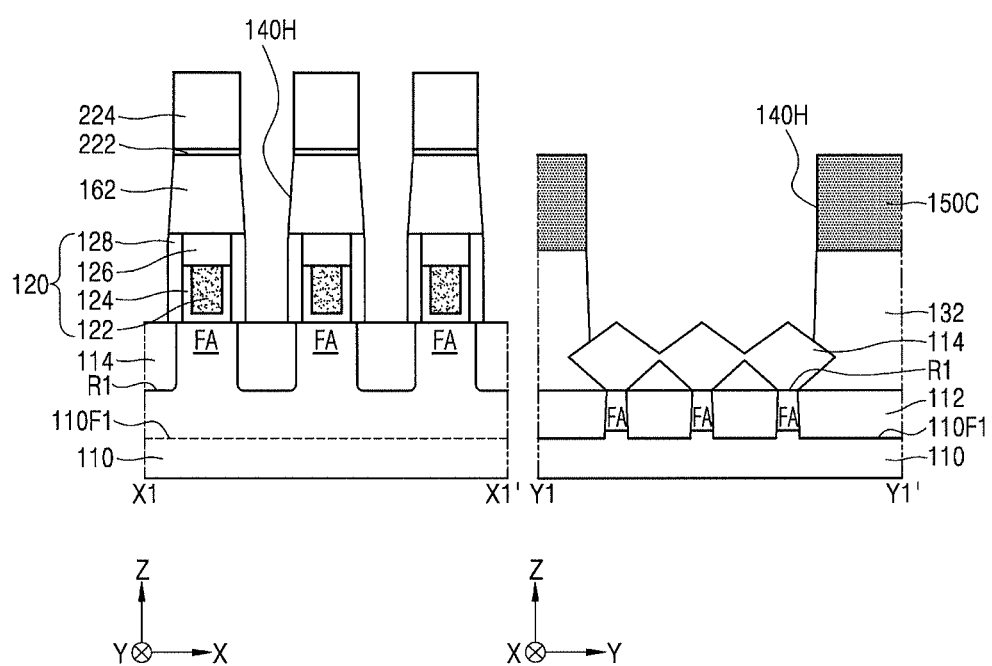
Figure 15B:
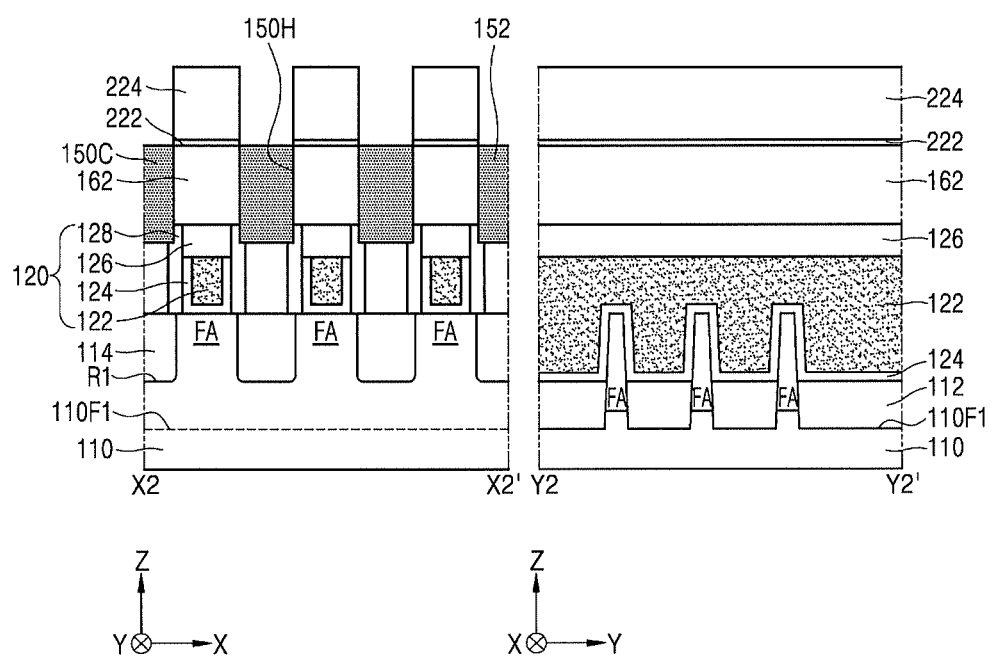

Referring to FIGS. 15A and 15B, the first interlayer insulation layer 162 may be partly removed using the second lower material pattern 222 and the line mask pattern 224 as an etch mask, thus forming the first contact holes 140H exposing an upper surface of each of the source/drain regions 114.

The process of forming the first contact holes 140H may be a self-aligned etch process. For example, the plurality of first contact block structures 150C, the pair of second contact block structures 152, and the gate spacers 128 may be left unremoved in the process of forming the first contact holes 140H. Thus, the first contact holes 140H may be formed in regions defined between the plurality of first contact block structures 150C in the second direction Y and between two adjacent line mask patterns 224 in the first direction X.

In some embodiments, a silicide layer may be formed on the upper surface of each of the source/drain regions 114 exposed by the first contact holes 140H. However, in some embodiments, the formation of the silicide layer may be omitted.

The second lower material pattern 222 and the line mask pattern 224 may be removed.

Figure 16A:
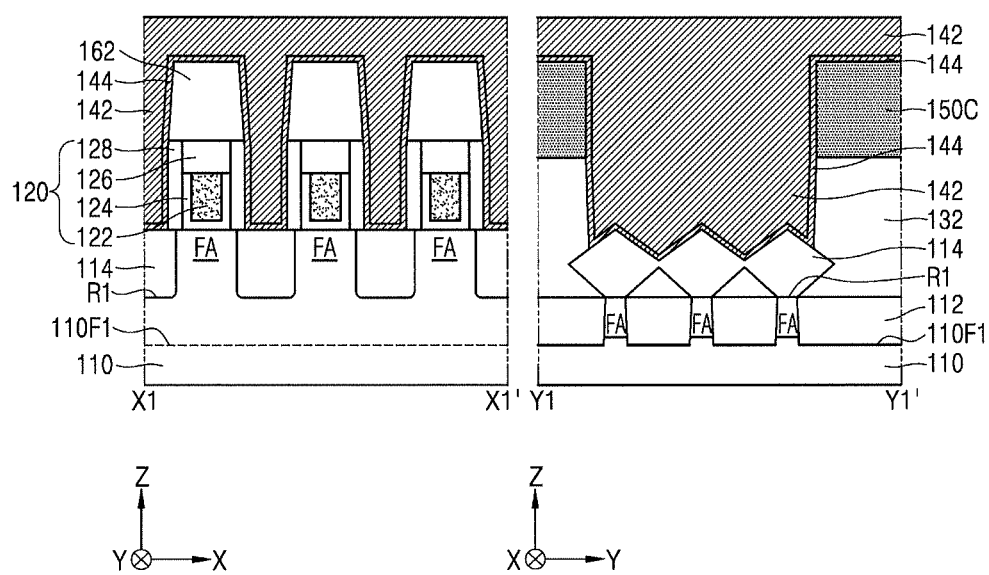
Figure 16B:
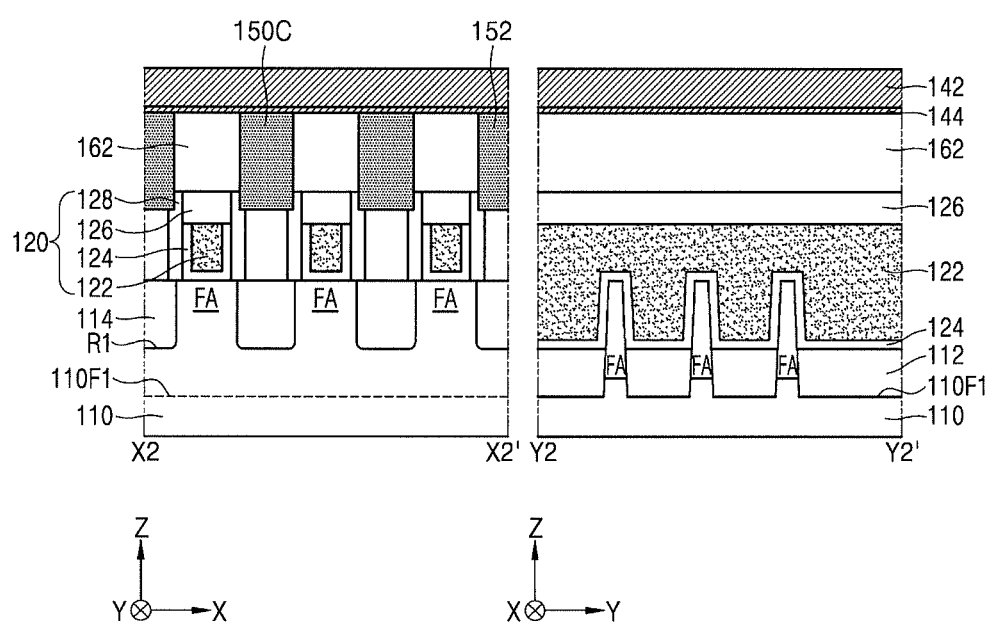

Referring to FIGS. 16A and 16B, the first barrier layers 144 and the first contact plugs 142 may be sequentially formed on the first interlayer insulation layer 162 to fill the first contact holes 140H.

Figure 17A:
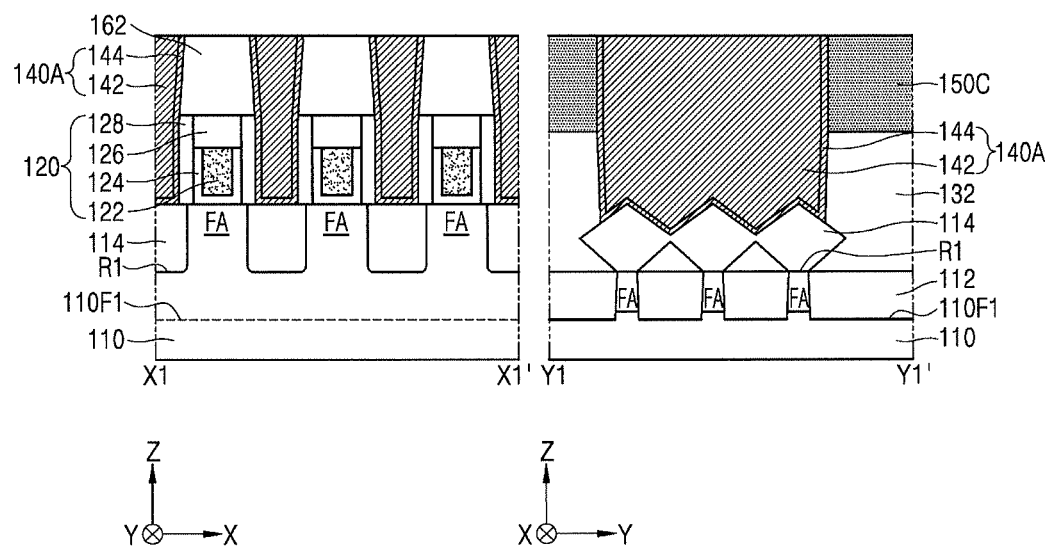
Figure 17B:
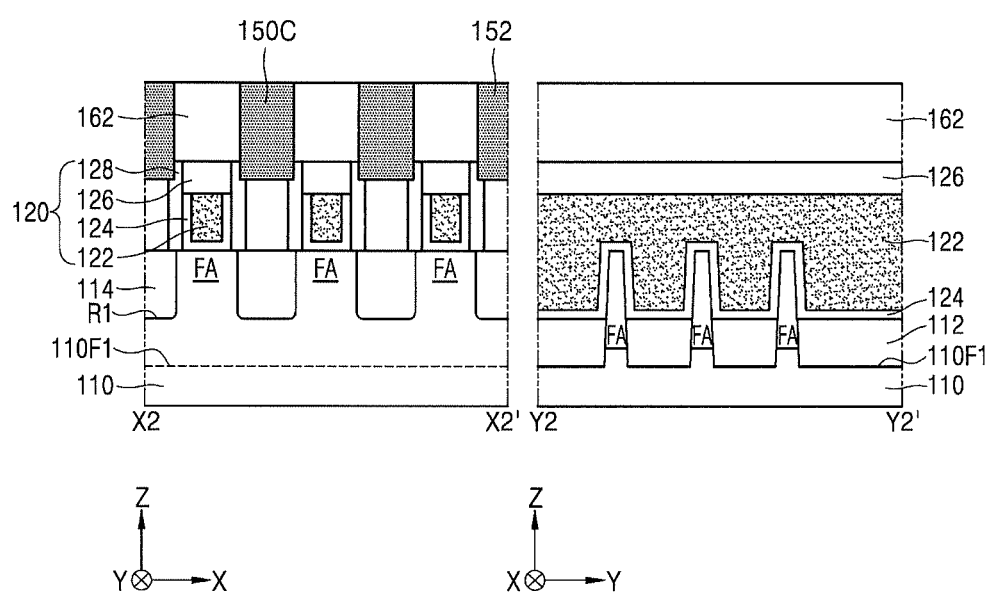

Referring to FIGS. 17A and 17B, upper portions of the first barrier layers 144 and upper portions of the first contact plugs 142 may be planarized until upper surfaces of the plurality of first contact block structures 150C and upper surfaces of the pair of second contact block structures 152 are exposed, such that the first contact plugs 142 and the first barrier layers 144 remain in the first contact holes 140H. Thus, the first contact structures 140A including the first contact plugs 142 and the first barrier layers 144 may be formed in the first contact hole 140H.

Figure 18A:
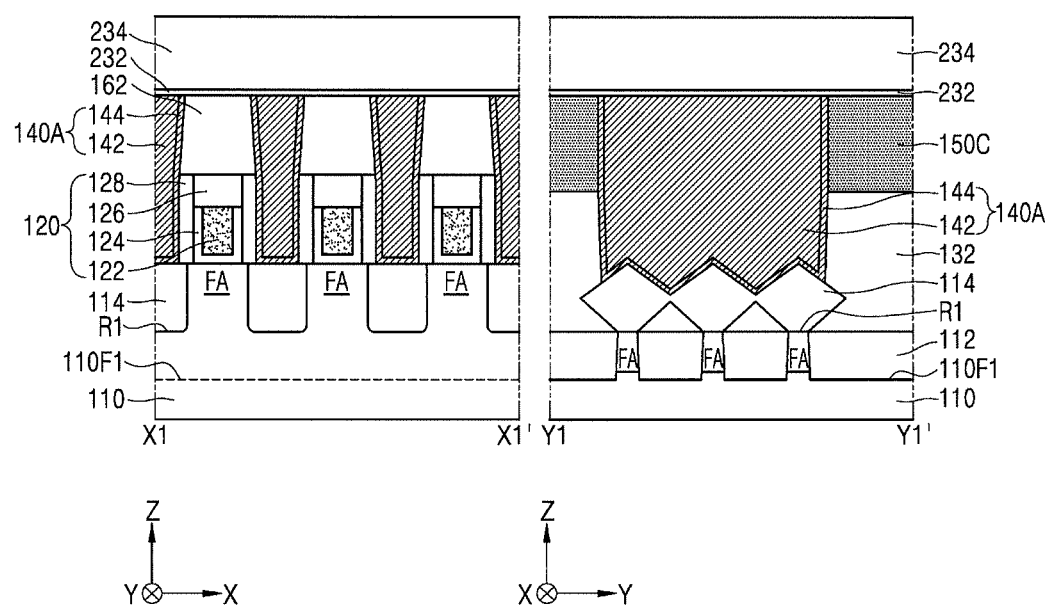
Figure 18B:
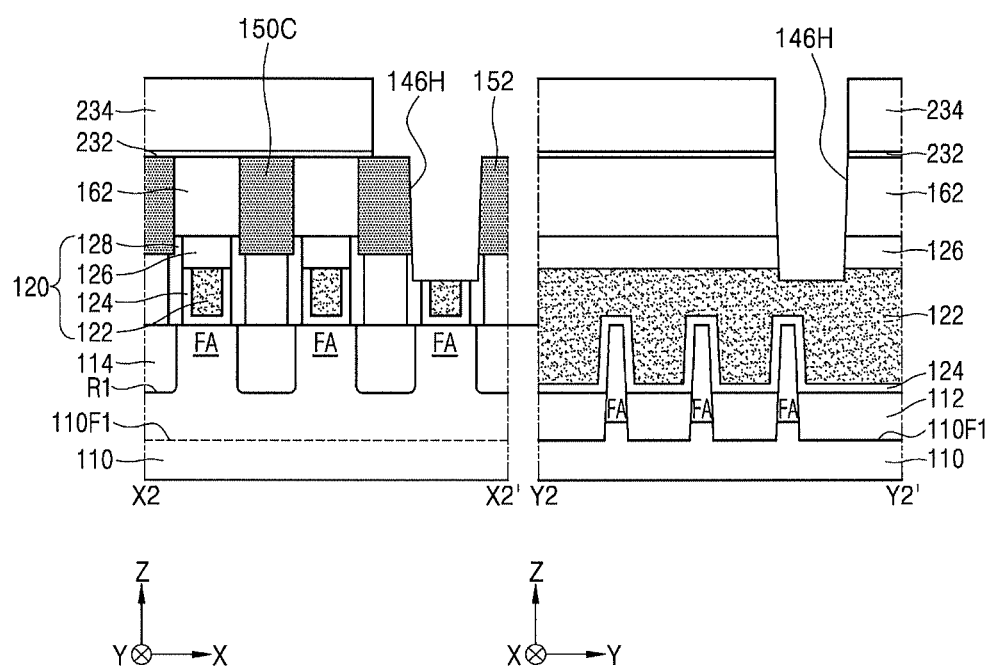

Referring to FIGS. 18A and 18B, a third lower material pattern 232 and a mask pattern 234 may be formed on the first interlayer insulation layer 162.

The third lower material pattern 232 may include, e.g., silicon oxynitride, silicon nitride, or silicon oxide. The mask pattern 234 may include a material having an etch selectivity with respect to the third lower material pattern 232 among silicon oxynitride, silicon nitride, spin on hardmask (SOH), spin on dielectric (SOD), and silicon oxide.

The mask pattern 234 may completely cover upper surfaces of the first contact structures 140A. Portions of the upper surfaces of the pair of second contact block structures 152 may not be covered by the mask pattern 234.

A portion of the first interlayer insulation layer 162 and a portion of the gate capping layer 126 may be removed using the third lower material pattern 232 and the mask pattern 234 as an etch mask, to form the second contact hole 146H exposing an upper surface of the gate electrode 122. In the process of forming the second contact hole 146H, portions of the upper surfaces of the pair of second contact block structures 152 may be left unremoved, but embodiments are not limited thereto. The third lower material pattern 232 and the mask pattern 234 may be removed.

Figure 19A:
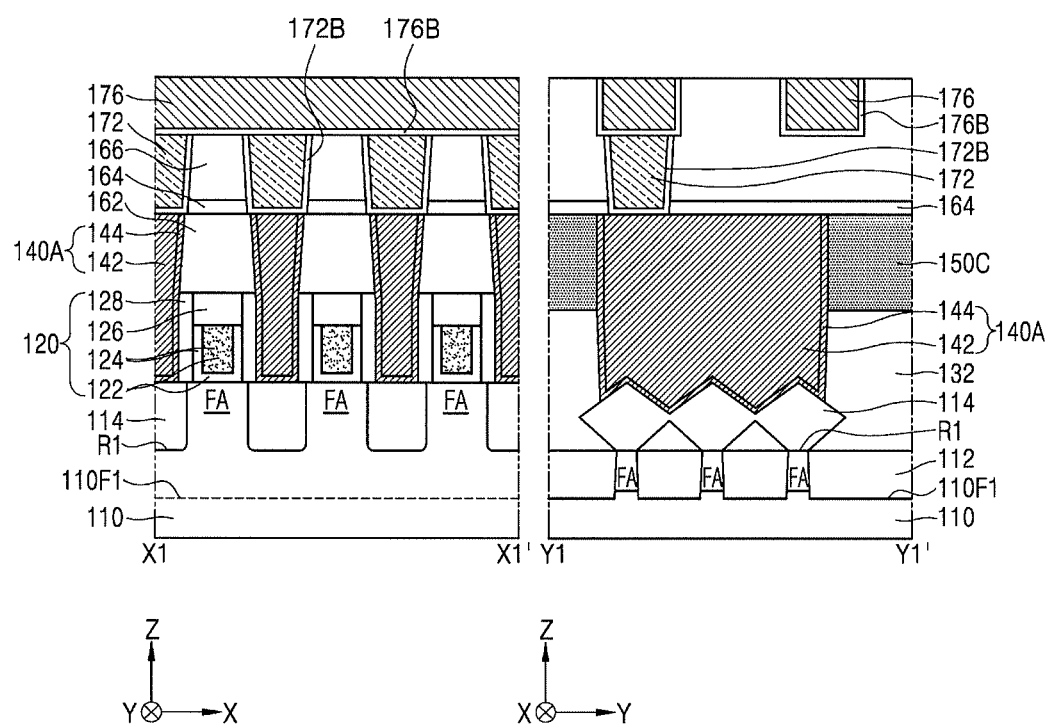
Figure 19B:
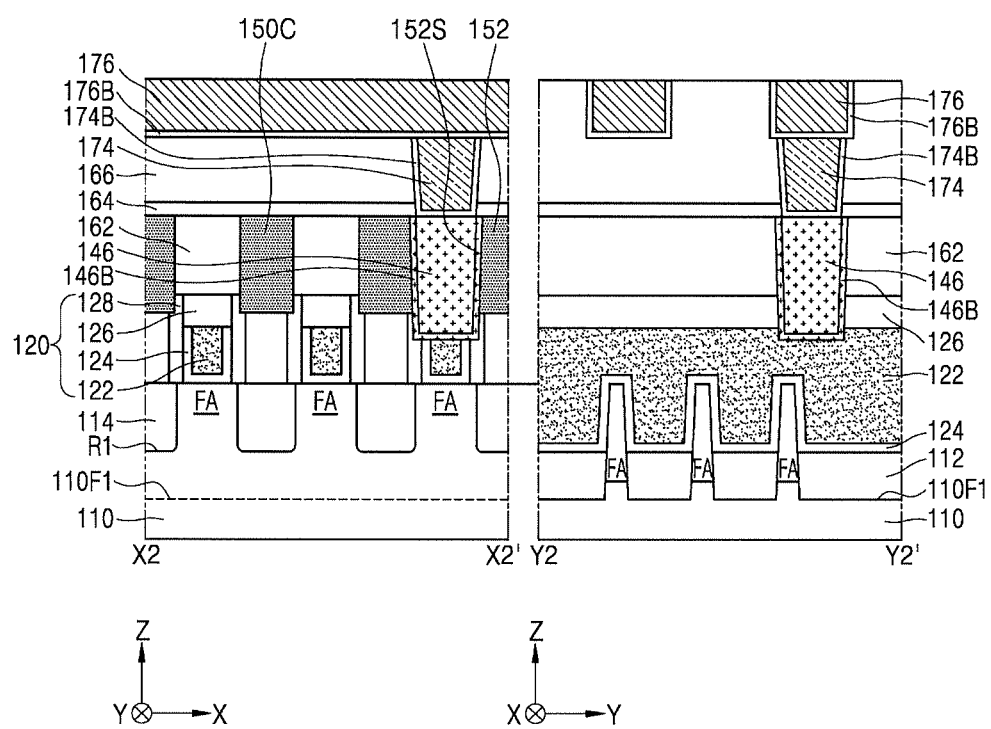

Referring to FIGS. 19A and 19B, a conductive layer may be formed on the first interlayer insulation layer 162 and the pair of second contact block structures 152, and then an upper surface of the conductive layer may be planarized until exposing the upper surfaces of the pair of second contact block structures 152, such that the second barrier layer 146B and the second contact structure 146 may be formed to fill the second contact hole 146H.

The etch stop layer 164 and the second interlayer insulation layer 166 may be sequentially forming on the first interlayer insulation layer 162, the first contact structures 140A, the second contact structure 146, the plurality of first contact block structures 150C, and the pair of second contact block structures 152.

A plurality of first via holes exposing the upper surfaces of the first contact structures 140A and a second via hole exposing the upper surface of the second contact structure 146 may be formed. A conductive layer may be formed on the second interlayer insulation layer 166 to form the third barrier layers 172B on inner surfaces of the first via holes and to form the fourth barrier layer 174B on an inner surface of the second via hole. An additional conductive layer may be formed in the first via holes and the second via hole having the third barrier layer 172B and the fourth barrier layer 174B, respectively, and then the additional conductive layer may be planarized to form the first vias 172 connected to the first contact structures 140A and the second via 174 connected to the second contact structure 146.

Then, the second interlayer insulation layer 166 may be etched to form a wiring groove, and the fifth barrier layer 176B and the upper wiring layer 176 may be sequentially formed in the wiring groove.

In general, the first contact structures 140A may be formed by forming island type contact holes in confined regions between the adjacent gate electrodes 122 and filling the island type contact holes with a conductive material. For example, to form the island type contact holes having a relatively narrow width, a linear type line mask pattern extending in the second direction Y may be formed on a target layer, a cutting mask pattern extending in the first direction X crossing the second direction Y may be formed, and portions of the target layer exposed commonly by the line mask pattern and the cutting mask pattern may be removed to form a contact hole pattern in the target layer. The contact hole may be formed by removing a material layer, e.g., the inter-gate insulation layer 132, below the target layer using the contact hole pattern in the target layer. However, the process for forming the contact hole pattern using the line mask pattern and the cutting mask pattern may be performed by complicated multiple process steps.

However, according to a method of manufacturing the integrated circuit device 100D described above, the first contact holes 140H may be formed by forming the line mask pattern 224 extending direction Y after forming the plurality of first contact block structures 150C, and using the plurality of first contact block structures 150C and the gate spacers 128 as a self-aligned etch mask in the etch process using the line mask pattern 224. Thus, an additional process for forming the target layer and the contact hole pattern may not be performed, and thus the first contact holes 140H may be formed by the reduced process steps.

Furthermore, since the first contact structures 140 may be formed to have a relatively large area by the self-aligned etch process using the gate spacers 128 and the plurality of first contact block structures 150C, a contact area between the source/drain region 114 and the first contact structures 140 in the first contact holes 140H may increase such that a reliable electrical connection may be obtained.

In the process described with reference to FIGS. 12A and 12B, the pair of first openings 150H may be formed to extend in the vertical direction to expose the source/drain regions 114 and an upper surface of the isolation layer 112. The pair of first contact block structures 150A (refer to FIGS. 3 and 4) filling the pair of first openings 150H may have lower surfaces that are coplanar with the lower surface of the gate structure 120, and an entirety of each of the sidewalls of the first contact structure 140 in the second direction Y may contact or be adjacent to each of the pair of first contact block structures 150A (e.g., a sidewall of the pair of first contact block structures 150A in the second direction Y) (refer to FIGS. 3 and 4). In the etch process for forming the first contact hole 140H, an etch selectivity may increase, and damages of the gate spacers 128 may be reduced or prevented. In this case, the integrated circuit device 100A described with reference to FIGS. 3 and 4 may be obtained.

In the process described with reference to FIGS. 12A and 12B, the pair of first openings 150H may be formed at a small depth not to expose the upper surface of the gate structure 120 and/or the upper surface of the inter-gate insulation layer 132. In the etch process for forming the pair of first openings 150H, the gate structure 120 may not be exposed by being covered by the first interlayer insulation layer 162, such that damages of the gate spacers 128 may be prevented. In this case, the integrated circuit device 100B described with reference to FIGS. 5 and 6 may be achieved.

While the present inventive concepts have been particularly shown and described with reference to example embodiments thereof, it will be understood by those of ordinary skill in the art that various changes in form and details may be made therein without departing from the spirit and scope of the inventive concepts as embodied by the following claims.

What is claimed is:

1. An integrated circuit device comprising:
   a substrate including a fin active region extending in a first direction;
   a gate structure crossing the fin active region and extending in a second direction crossing the first direction;
   source/drain regions on the fin active region at opposite sides of the gate structure;
   a first contact structure electrically connected to one of the source/drain regions, the first contact structure comprising first and second sidewalls opposite each other in the second direction and a third sidewall adjacent the gate structure;
   a pair of first contact block structures on the first and second sidewalls, respectively, of the first contact structure; and
   an interlayer insulation layer on the gate structure, the interlayer insulation layer adjacent to the third sidewall of the first contact structure and adjacent to a fourth sidewall of each of the pair of first contact block structures in the first direction,
   wherein at least one of the first contact block structures, in the pair of first contact block structures, has a width in the first direction that is greater than a width of the first contact structure in the first direction.

2. The device of claim 1, wherein uppermost surfaces of the pair of first contact block structures are coplanar with an uppermost surface of the first contact structure.

3. The device of claim 1, wherein each of the first and second sidewalls of the first contact structure contacts a fifth sidewall of a corresponding one of the pair of first contact block structures in the second direction.

4. The device of claim 1, wherein lowermost surfaces of the pair of first contact block structures are positioned at a lower level with respect to the substrate than a level with respect to the substrate of an upper surface of the gate structure.

5. The device of claim 1, further comprising an inter-gate insulation layer on a sidewall of the gate structure, wherein upper portions of the first and second sidewalls of the first contact structure contact a fifth sidewall of a corresponding one of the pair of first contact block structures in the second direction, and wherein lower portions of the first and second sidewalls of the first contact structure contact the inter-gate insulation layer.

6. The device of claim 1, wherein the gate structure comprises:
a gate electrode that extends in the second direction; and
a gate spacer that is on a sidewall of the gate electrode and extends in the second direction, wherein the gate spacer contacts both of the pair of first contact block structures.

7. The device of claim 1, wherein lowermost surfaces of the pair of first contact block structures are positioned at a higher level with respect to the substrate than a level with respect to the substrate of an uppermost surface of the gate structure.

8. The device of claim 1, wherein ones each of the pair of first contact block structures contact a respective one of the first and second sidewalls of the first contact structure and respectively extend from an uppermost portion of the respective one of the first and second sidewalls of the first contact structure to a lowermost portion of the respective one of the first and second sidewalls of the first contact structure.

9. The device of claim 8, wherein lowermost surfaces of the pair of first contact block structures are positioned at a same level with respect to the substrate as a level with respect to the substrate of a lowermost surface of the gate structure.

10. The device of claim 1, further comprising:
a second contact structure connected to the gate structure; and
a pair of second contact block structures on opposite sidewalls of the second contact structure in the first direction.

11. The device of claim 10, wherein uppermost surfaces of the pair of second contact block structures are coplanar with an uppermost surface of the second contact structure.

12. An integrated circuit device comprising:
a substrate including a fin active region extending in a first direction;
a plurality of gate structures crossing the fin active region and extending in a second direction crossing the first direction;
a source/drain region on the fin active region between adjacent ones of the gate structures;
a first contact structure on the source/drain region, between the adjacent ones of the gate structures; and
a pair of first contact block structures on opposite sidewalls, respectively, of the first contact structure, between the adjacent ones of the gate structures,
wherein the pair of first contact block structures are spaced apart from each other in the second direction, and
wherein at least one of the first contact block structures, in the pair of first contact block structures, has a width in the first direction that is greater than a width of the first contact structure in the first direction.

13. The device of claim 12, wherein each of the first contact block structures, in the pair of first contact block structures contacts a corresponding one of the opposite sidewalls of the first contact structure.

14. The device of claim 12, further comprising an inter-gate insulation layer between the adjacent ones of the gate structures, wherein upper portions of the opposite sidewalls of the first contact structure contact corresponding one of the pair of first contact block structures, respectively, and wherein lower portions of the opposite sidewalls of the first contact structure contact the inter-gate insulation layer.

15. An integrated circuit device comprising:
a substrate including a fin active region extending in a first direction;
a plurality of gate structures crossing the fin active region and extending in a second direction crossing the first direction;
a source/drain region on the fin active region between two adjacent ones of the gate structures;
a first contact structure on the source/drain region, between the two adjacent ones of the gate structures;
a pair of first contact block structures on opposite sidewalls, respectively, of the first contact structure, between the two adjacent ones of the gate structures; and
an interlayer insulation layer on the plurality of gate structures, the interlayer insulation layer contacting the pair of first contact block structures and the first contact structure,
wherein at least one of the first contact block structures, in the pair of first contact block structures, has a width in the first direction that is greater than a width of the first contact structure in the first direction.

16. The device of claim 15, further comprising an inter-gate insulation layer between the adjacent ones of the gate structures,
wherein upper portions of the opposite sidewalls of the first contact structure contact a corresponding one of the pair of first contact block structures, and
wherein lower portions of the opposite sidewalls of the first contact structure contact the inter-gate insulation layer.

17. The device of claim 15, wherein each of the gate structures includes a gate electrode extending in the second direction and a gate spacer on a sidewall of the gate electrode, and
wherein the pair of first contact block structures contact the gate spacer of each of the two adjacent ones of the gate structures.

18. The device of claim 17, wherein lowermost surfaces of the pair of first contact block structures are positioned at a lower level with respect to the substrate than a level with respect to the substrate of uppermost surfaces of the gate structures.

* * * * *